(12) United States Patent
Tran et al.

(10) Patent No.: US 6,580,149 B2
(45) Date of Patent: Jun. 17, 2003

(54) DOUBLE LDD DEVICES FOR IMPROVED DRAM REFRESH

(75) Inventors: Luan C. Tran, Meridian, ID (US); Mark McQueen, Boise, ID (US); Robert Kerr, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/046,737

(22) Filed: Jan. 17, 2002

(65) Prior Publication Data

US 2002/0068395 A1 Jun. 6, 2002

Related U.S. Application Data

(62) Division of application No. 09/642,780, filed on Aug. 22, 2000, now Pat. No. 6,455,362.

(51) Int. Cl.[7] .............................................. H01L 29/00
(52) U.S. Cl. ...................... 257/549; 257/288; 257/296
(58) Field of Search ........................ 257/61, 296, 336, 257/344, 376, 408, 399, 519, 544, 545, 653, 654, 929, 549, 550, 288, 398, 400, 401, 917

(56) References Cited

U.S. PATENT DOCUMENTS

| | | | |
|---|---|---|---|
| 4,366,613 A | 1/1983 | Ogura et al. | |
| 4,753,898 A | * 6/1988 | Paeeillo et al. | ............. 156/643 |
| 5,376,566 A | 12/1994 | Gonzalez | |
| 5,439,835 A | 8/1995 | Gonzalez | |
| 5,496,751 A | 3/1996 | Wei et al. | |
| 5,534,449 A | 7/1996 | Dennison et al. | |
| 5,631,485 A | 5/1997 | Wei et al. | |
| 5,719,424 A | 2/1998 | Ahmad et al. | |
| 5,736,440 A | 4/1998 | Manning | |
| 5,747,855 A | 5/1998 | Dennison et al. | |
| 5,877,530 A | 3/1999 | Aronowitz et al. | |
| 6,187,620 B1 | * 2/2001 | Fulford, Jr. et al. | ......... 438/230 |
| 6,455,362 B1 | * 9/2002 | Tran et al. | .................. 438/194 |

* cited by examiner

*Primary Examiner*—David Nelms
*Assistant Examiner*—David Nhu
(74) *Attorney, Agent, or Firm*—Dickstein Shapiro Morin & Oshinsky LLP

(57) ABSTRACT

An integrated circuit device with improved DRAM refresh characteristics, and a novel method of making the device, is provided. A semiconductor substrate is provided with gate structures formed on its surface in each of an array portion and a peripheral portion. Single lightly doped regions are formed adjacent to the channel regions by ion implantation in the substrate. Dielectric spacers having a first width are formed on the substrate surface adjacent to the gate structures covering at least a portion of the single lightly doped regions. Heavily-doped regions are ion-implanted on opposite sides of the gate structure in the peripheral portion. The dielectric spacers are etched back to a second width smaller than the first width. Double lightly doped regions are formed by ion implantation in the substrate in an area of the substrate left exposed by the spacer etch back. Triple lightly doped regions may be also be formed by a first implant at the gate edge, a second implant through an intermediate spacer, and a third implant after the spacer etch back.

15 Claims, 15 Drawing Sheets

DOUBLE LDD DEVICES FOR IMPROVED DRAM REFRESH

This application is a divisional of application Ser. No. 09/642,780, filed on Aug. 22, 2000, now U.S. Pat. No. 6,455,362 issued Sep. 24, 2002 which is incorporated herein by reference.

BACKGROUND OF THE INVENTION

1. Field of the Invention

The present invention relates to the field of integrated circuits and, more particularly, to semiconductor devices having double lightly doped regions for improved DRAM refresh characteristics and methods for their manufacture.

2. Description of the Related Art

Metal oxide semiconductor (MOS) structures are basic electronic devices used in many integrated circuits. One such structure is the MOS field effect transistor (MOSFET), which is typically formed in a semiconductor substrate by providing a gate structure over the substrate to define a channel region, and by forming source and drain regions on opposing sides of the channel region.

MOSFETs are often used in the formation of memory circuits, including dynamic random access memory (DRAM) circuits. DRAM circuits are composed of an array of individual memory cells, each cell including a capacitor for holding a charge and an access transistor for accessing the charge held in the capacitor.

In a typical DRAM cell using a MOSFET access transistor, after a charge is stored the charge does not remain in the capacitor indefinitely, but instead slowly leaks out of the p-n junction of the access transistor for the cell. This phenomenon is known as "junction leakage." To avoid losing the cell contents, the charge must be periodically re-stored in the capacitor through a process known as "refresh." Increased junction leakage leads to premature depletion of the capacitor's stored charge, necessitating more frequent refresh operations. Refresh operations consume device resources and it is therefore desirable to reduce junction leakage as much as possible and thus reduce the frequency of required refresh operations.

Several factors are known to contribute to junction leakage, including (a) the electric field (E) generated at the p-n junction, (b) surface- or bulk-defect-induced recombination/generation current, and (c) gated diode assisted band-to-band tunneling leakage, such as gate-induced drain-leakage (GIDL) current. In particular, factor (a), the electric field (E) generated at the p-n junction, is proportional to the gradient of the doping concentration of either side of the junction. Because junction leakage varies directly with this electric field (i.e. higher E leads to higher junction leakage), it is desirable to control the doping concentration on both sides of the p-n junction. By controlling the doping concentration on both sides of the junction to reduce the gradient of the doping concentration, the p-n junction electric field (E) can be reduced and hence junction leakage.

The gradient of the doping concentration at the p-n junction of a MOSFET in a DRAM array depends on the doping concentration of the channel region and the doping concentration of the ion-implanted regions adjacent the channel serving as source/drain regions for a cell access transistor. For example, in an NMOS transistor, the channel is doped with p-type impurities, the source and drain regions are doped with n-type impurities, and as the boundary between the p-type channel and the n-type drain region is approached, the rate of change in impurity concentration defines the gradient of the doping concentration. An abrupt change in impurity concentration from p-type to n-type doping at the boundary creates a high gradient, high electric field (E) and hence increases junction leakage. A more gradual change from p-type to n-type doping concentration, for example using lightly doped drain (LDD) regions, creates a relatively lower gradient, lower electric field (E) and hence decreases junction leakage.

There are several tradeoffs that must be taken into account when formulating the doping concentrations on either side of the p-n junction. For example, in an NMOS transistor, the p-type doping concentration of the channel should be sufficiently high to turn off the transistor when the gate is off (i.e., low subthreshold leakage). On the other hand, the channel doping concentration should not be so high that a full potential of charge is prevented from being transferred from source to drain when the gate is on.

Likewise, the n-type doping concentration of the source and drain regions should be sufficiently high to obtain satisfactorily low series resistance and threshold voltage. If the n-type doping concentration is too low, transistor current drive may be degraded and a wider depletion width may result, possibly leading to undesirable levels of reverse bias current. On the other hand, if the n-type doping concentration is too high, undesirable junction leakage effects can result as discussed above. Thus, it would be desirable to form the memory array taking the above considerations into account and produce memory cells in which the electric field generated at the p-n junction is reduced for each cell and hence reduce junction leakage.

Another problem associated with the electric field generated at the p-n junction is the "hot carrier" or "hot electron" effect wherein energetic charge carriers, typically electrons and/or holes, are accelerated by a strong electric field, such as that created at the p-n junction. Such high strength electric fields accelerate the energetic carriers, known as "hot carriers," toward the gate electrode and the underlying gate oxide. These hot carriers are thus injected into the thin dielectric layer of the gate structure and into the adjacent thicker dielectric gate spacer structure, resulting in damage to the gate oxide as well as to the gate spacer structure. Over time, these hot electrons create a permanent charge in the thin dielectric layer and the dielectric spacers, degrading or destroying the performance of the associated MOSFET device. This is typically more of a problem with N-channel MOSFETS (which have electrons as the primary carrier species) than P-channel MOSFETS (which have "holes" as the primary carrier species).

The above problems are well known in the art and have resulted in the widely practiced remedy of forming lightly doped drain (LDD) regions between the source/drain regions and the channel region in the semiconductor substrate. This LDD region reduces the gradient of the doping concentration at the boundary (p-n junction) between the source/drain regions and the channel region to thereby lower the strength of the electric field (E) generated at the p-n junction. This reduction in the electric field (E) results in decreased junction leakage and reduces the hot carrier effect.

For example, U.S. Pat. No. 4,366,613 to Ogura et al. ("Ogura") discloses the formation of LDD regions in a RAM MOSFET. Referring to FIG. 1, MOSFET device 5 includes a gate structure comprising an access gate conductor 16 and a gate top insulator 20 formed over an oxide layer 18 that is formed on a substrate 12. Insulating spacers 32, 34 are formed on sidewalls of the gate structure. The device also includes source/drain regions 36, 38 and two lightly doped regions 22 and 24, one of which is provided proximate to each of the source/drain regions 36, 38. A channel 15 extends between the LDD regions 22 and 24. By providing the LDD regions 22 and 24, the electric field at the p-n junction between the channel 15 and the source/drain regions 36, 38 is reduced, thereby reducing the junction leakage and the hot carrier effect.

The prior art LDD structure of FIG. 1 can be made by a variety of processes, but is typically made by providing a low-density ion implant of the LDD regions 22, 24 before adding oxide spacers 32, 34 to the gate structure (see U.S. Pat. No. 4,366,613 to Ogura). After the spacers 32, 34 have been added to the gate structure, a higher-density ion implant is made to form the source and drain regions 36, 38. Since the source and drain regions 36, 38 were implanted after the formation of the spacers 32, 34, they are offset further from the channel 15 than the LDD regions 22, 24. The resulting structure exhibits a decreased electric field at the p-n junction.

Although LDD structures have helped advance the state of the art, increasing competition in the semiconductor industry, particularly in the development of DRAM devices and methods, have created a need and desire for greater device performance, especially in the area of lower refresh rates. It would, therefore, be desirable if the problems of junction leakage and hot carrier generation at the p-n junction could be further reduced in a MOSFET access transistor of a memory cell, using conventional processing and manufacturing techniques and at a reasonable cost.

SUMMARY OF THE INVENTION

The present invention provides a technique for forming double LDD regions at the p-n junction of a MOSFET access transistor of a memory cell that reliably improves the refresh characteristics of DRAM memory devices without substantially increasing manufacturing costs, with the added benefit of LDD peripheral devices resistant to hot carrier effects.

The above and other features and advantages of the invention are achieved by providing a DRAM memory circuit composed of novel integrated circuit devices, and a novel method of making the devices, including a memory cell with an access transistor with double LDD regions in addition to lightly doped LDD regions in a conventional metal oxide semiconductor field effect transistor (MOSFET), with or without using an additional mask. In the process of making the devices, a semiconductor substrate is provided with a gate structure formed on its surface, thereby defining a channel region in the substrate beneath the gate having a source side and a drain side. Next, lightly doped LDD regions are formed adjacent to the channel region by ion implantation in the substrate. Then, insulating spacers of a first width are formed adjacent to the sidewalls of the gate structure covering at least a portion of each of the LDD regions. Next, the memory array portion of the DRAM circuit is masked and heavily-doped source/drain regions are formed in the unmasked periphery MOSFETs by ion implantation in the substrate. The mask is then removed, and the insulating spacers are etched back to a second width smaller than the first width. Then, double LDD regions are formed by lightly doping the substrate in the memory array and in the periphery MOSFET areas. The structures formed in this method permit reduced channel doping in the memory array, reduced doping concentration gradient near the p-n junction, and hence a reduced electric field at the p-n junctions in both the memory array and peripheral MOSFETS.

The present invention thus provides an improved doping profile at the p-n junction between the channel and the source/drain regions, thereby improving DRAM refresh characteristics by reducing junction leakage. In addition, the hot carrier effect is reduced for periphery MOSFETs. Furthermore, these favorable results were obtained using conventional masking and etching techniques, obviating the need for unconventional processing techniques at a higher cost and failure rate.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF PREFERRED EMBODIMENTS

The following discussion of the apparatus and method of forming the apparatus will help illuminate the advantages of this semiconductor device and method, including its ease of formation using conventional growth, deposition and etching techniques which are well known in the art.

In the following discussion, the terms "wafer" and "substrate" are used interchangeably and are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate," previous process steps may have been utilized to form regions or junctions in the base semiconductor structure or foundation.

In addition, no particular order is required for the method steps described below, with the exception of those logically requiring the results of prior steps, for example formation of spacers 32, 34 adjacent to gate 16 logically requires the prior formation of the gate 16. Otherwise, enumerated steps are provided below in an exemplary order which may be altered, for instance the several ion implant steps may be rearranged using masking and etching steps well known in the art.

Figure 9:
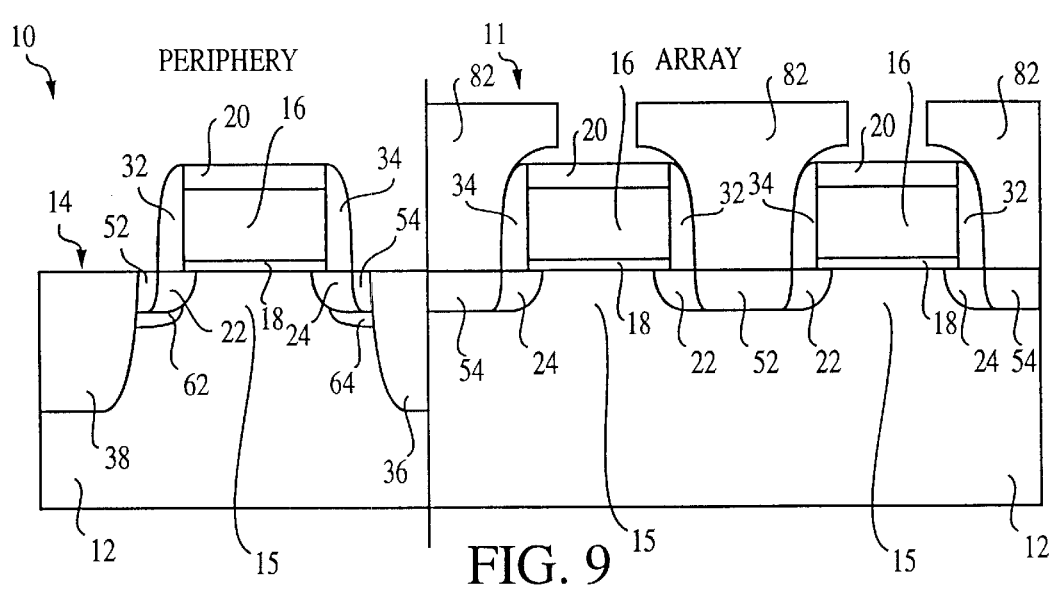
FIG. 9 is a fragmentary vertical cross sectional view of the structure of FIG. 8 at a later stage of formation.

FIG. 9 illustrates a memory circuit formed in accordance with an exemplary embodiment of the present invention. The memory circuit includes a periphery portion 10 and a memory array portion 11, constructed on separate areas of the integrated circuit die. The periphery device 10 includes a substrate 12 with a substrate surface 14 on which rests a gate oxide 18, a gate 16 and a gate top insulator 20. Dielectric spacers 32, 34 are formed on the substrate surface 14 adjacent the gate 16. The gate 16 operates on a channel region 15 in the substrate 12 adjacent to single lightly doped drain (LDD) regions 22, 24. Extending laterally away from the channel region 15 on both sides, halo implant regions 62, 64 are optionally formed adjacent to the single LDD regions 22, 24, which are in turn adjacent to double LDD regions 52, 54, and beyond which lie heavily doped source/drain regions 36, 38. Double LDD regions 52 and 54 help form a lesser gradient at the p-n junction.

FIG. 9 also illustrates the memory array portion of the memory circuit formed in accordance with an exemplary embodiment of the present invention. The array portion 11 includes access transistors of memory cells. The access transistor includes a substrate 12 with a substrate surface 14 on which rests multiple gate structures each composed of a gate oxide 18, a gate 16 and a gate top insulator 20. Dielectric spacers 32, 34 are formed on the substrate surface 14 on either side of each gate structure. The gate 16 operates on a channel region 15 in the substrate 12 adjacent to single lightly doped drain (LDD) regions 22, 24. Extending laterally away from the channel region 15 on both sides, single LDD regions 22, 24 are adjacent to double LDD regions 52, 54. Conductive plugs 82 are formed in the gap between adjacent gate structures of the array portion 11 and in contact with the substrate surface 14 above double LDD regions 52, 54.

Figure 1:
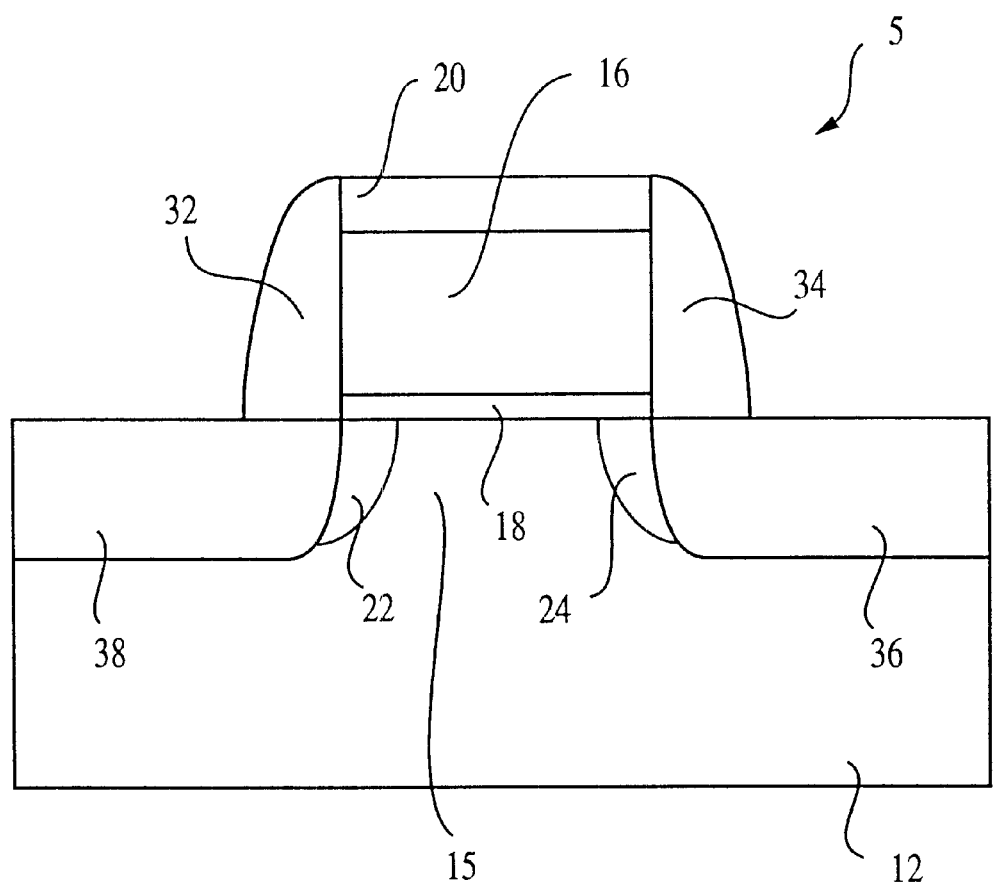
FIG. 1 is a fragmentary vertical cross-sectional view of a prior art device with conventional lightly doped drain (LDD) regions.
Figure 2:
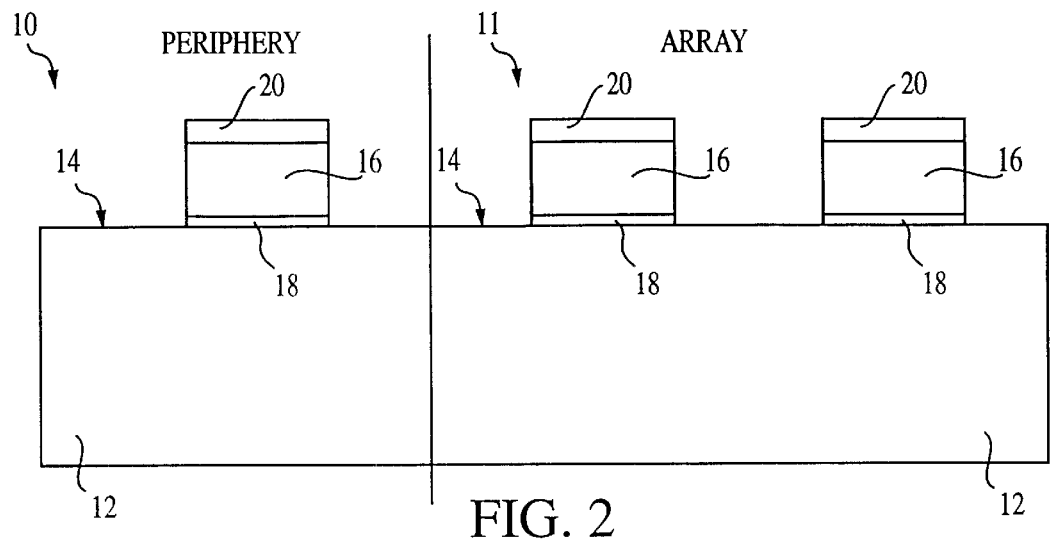
FIG. 2 is a fragmentary vertical cross sectional view of an integrated circuit device at an early stage of formation in accordance with the present invention.

FIGS. 2–9 illustrate the method of an exemplary embodiment of the present invention. FIG. 2 shows an integrated circuit device, including periphery portion 10 and array portion 11, in accordance with the present invention at an early stage of formation. Gate structures including gate oxides 18, gates 16 and gate top insulators 20 are formed on substrate surface 14 of substrate 12. Substrate 12 is composed of a semiconductor material, preferably silicon (Si) or a compound including silicon and germanium (SiGe) formed to have a substantially planar surface 14 in an area laterally adjacent to the gate 16. The gate oxide 18 is silicon dioxide or an equivalent dielectric that is thermally grown or deposited through processes well known in the art, such as chemical vapor deposition (CVD) or a combination of thermal growth and deposition. Gate top insulator 20 is formed from insulator materials well known in the art. The gate 16 is deposited polysilicon or equivalent conductive material that is formed using a photoresist and mask or equivalent process as is known in the art. The gate 16 and gate oxide 18 collectively define a channel region 15 in the substrate 12 beneath the gate 16.

The channel region 15 in the substrate 12 is lightly doped to permit the gate to influence charge carriers in the channel region 15 in response to activation of the gate 16. The invention allows for reducing the doping concentration of the channel region 15 in the array portion 11, thereby contributing to an improvement in refresh. For example, with the invention, channel doping concentration may be reduced up to about 30% when compared to the channel doping of a similarly-fabricated access transistor not having multiple LDD regions. Thus, a conventional channel doping concentration for an n-channel MOSFET of $2\times10^{17}$ (2e17) atoms per cubic centimeter may be reduced to $1.4\times10^{17}$ (1.4e17) atoms per cubic centimeter using the invention.

Figure 3:
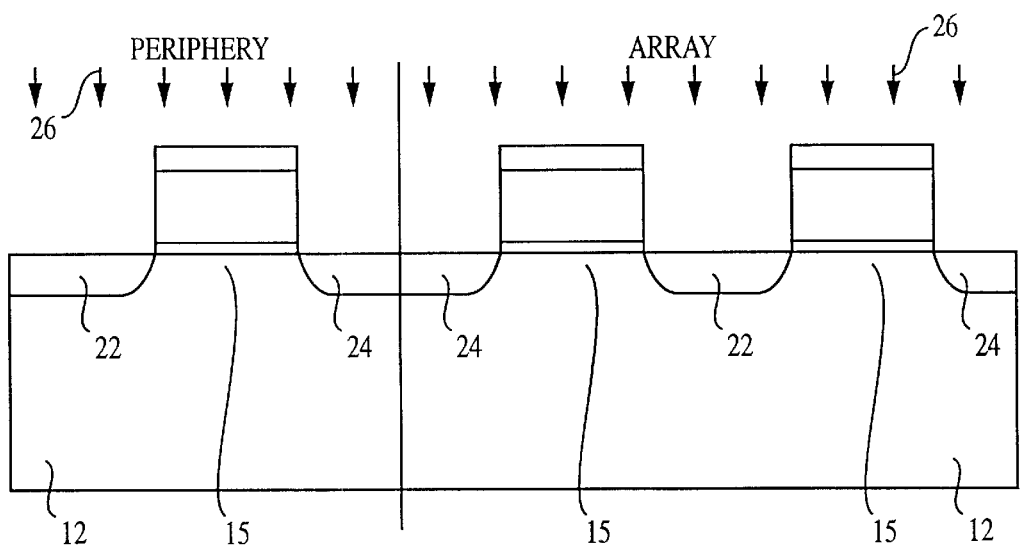
FIG. 3 is a fragmentary vertical cross sectional view of the structure of FIG. 2 at a later stage of formation.

Referring now to FIG. 3, single lightly doped drain (LDD) regions 22, 24 are formed in the substrate 12 adjacent the channel region 15 and extending laterally away from it. To create the single LDD regions 22 and 24, the substrate 12 is ion implanted with first light ion implant dose 26 composed of either n-type or p-type dopants, depending on whether an NMOS or PMOS device is desired. For an NMOS device, an n-type dopant is used, such as arsenic, phosphorus or antimony. For a PMOS device, a p-type dopant is used, such as boron, $BF_2$ or $B_2H_{10}$. A light doping and energy level is used to create the single LDD regions, such as a doping level of between about $1\times10^{12}$ (1e12) to $2\times10^{13}$ (2e13) atoms per square centimeter at an energy of between about 5–50 keV for arsenic, between about 2–20 keV for phosphorus, or 1 keV or less for p-type dopants. In the resulting device, the single LDD regions 22, 24 have a doping concentration of between about $5.0\times10^{17}$ (5.0e17) to $4.0\times10^{18}$ (4.0e18) atoms per cubic centimeter for n-type dopants, or between about $8.0\times10^{17}$ (8.0e17) to $8.0\times10^{18}$ (8.0e18) atoms per cubic centimeter for p-type dopants.

Figure 4:
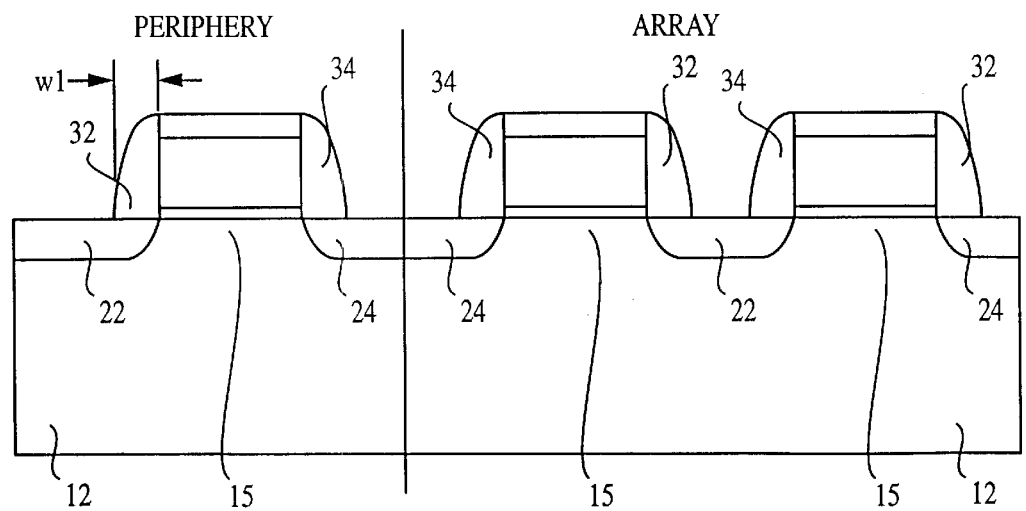
FIG. 4 is a fragmentary vertical cross sectional view of the structure of FIG. 3 at a later stage of formation.

Referring now to FIG. 4, dielectric spacers 32, 34 are formed on the substrate surface 14 adjacent the gate 16 and the gate oxide 18. The spacers 32, 34 are formed from a nonconductive material such as an oxide, nitride, or oxynitride, preferably tetraethylorthosilicate (TEOS). The spacers 32, 34 are formed by deposition and then anisotropically etched to a first width w1 using dry etching techniques as is known in the art, such as Reactive Ion Etching (RIE).

Figure 5:
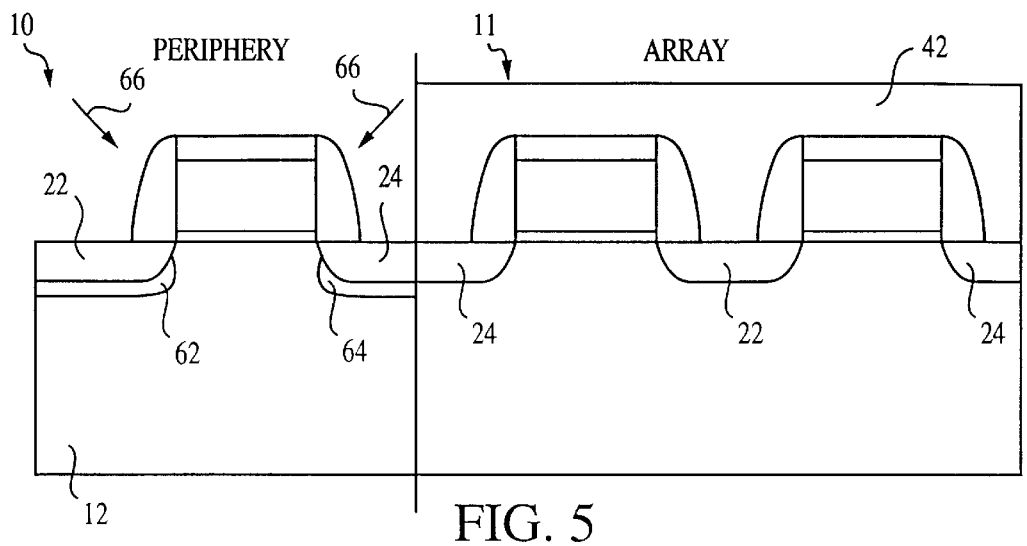
FIG. 5 is a fragmentary vertical cross sectional view of the structure of FIG. 4 at a later stage of formation.

Mask 42 then is applied as shown in FIG. 5 to shield the array portion 11 from halo implant dose 66 and heavy ion implant dose 44, discussed below. As illustrated in FIG. 5, a halo implant step 66 is performed in the peripheral portion 10 to form an integrated circuit device resistant to the "punchthrough" effect. The punchthrough effect occurs when, although the gate voltage is well below the threshold voltage for activation of the gate 16, the electric field of the drain 36 increases in size sufficiently to extend across the channel 15 to the source region 38, resulting in an increase in subthreshold current flow and a degradation of the electrical characteristics of the device. In order to reduce the negative effects of punchthrough, a halo implant 66 is commonly used to provide additional p-type or n-type doping (depending on whether an NMOS or PMOS device is being formed, respectively) in an area of the substrate 12 adjacent LDD regions 22, 24.

Referring to FIG. 5, halo ion implant dose 66 may be applied to the substrate 12 at an angle to substrate surface 14 to form halo implant regions 62, 64. The angle used for the implant is between about 0–45 degrees from the vertical (i.e. the halo implant may be straight down or at an angle of up to 45 degrees), and preferably about 15–30 degrees, depending on the space/height ratio of the two adjacent gates. A p-type halo ion implant 66 is conducted to provide a p-type doping concentration at a desired depth in the substrate 12 for an NMOS device, and an n-type halo ion implant 66 is conducted for a PMOS device. An example and preferred implant p-type material used for an NMOS device is boron or indium, and for a PMOS device phosphorus, arsenic or antimony is preferred. An example and preferred dose is between about $5\times10^{11}$ (5e11) to $5\times10^{12}$ (5e12) atoms per square centimeter in each direction four (4) times (×4) at an energy level of between about 30–100 keV, depending on source-drain/LDD junction depths. In this example, the halo implant 66 is penetrating the spacers 32, 34.

In the resulting device, the halo implant regions 62, 64 have a doping concentration of between about $1.0\times10^{17}$ (1.0e17) to $4.0\times10^{17}$ (4.0e17) atoms per cubic centimeter for n-type dopants (PMOS device), or between about $8.0\times10^{16}$ (8.0e16) to $4.0\times10^{17}$ (4.0e17) atoms per cubic centimeter for p-type dopants (NMOS device).

Note that halo implant 66 may be performed earlier in the method sequence. For example, halo implant 66 may be performed before or after formation of single LDD regions 22, 24 (i.e. between FIGS. 2 and 3 or between FIGS. 3 and 4). However, further masking and masking removal steps would be required to mask off the array. For example in FIG. 2, the array would be masked and the halo implant 66 performed in the periphery, then removed before implant 26 in FIG. 3. As a second example in FIG. 3, the array would be masked and the halo implant 66 performed in the periphery, then removed before formation of spacers 32, 34 in FIG. 4.

Figure 6:
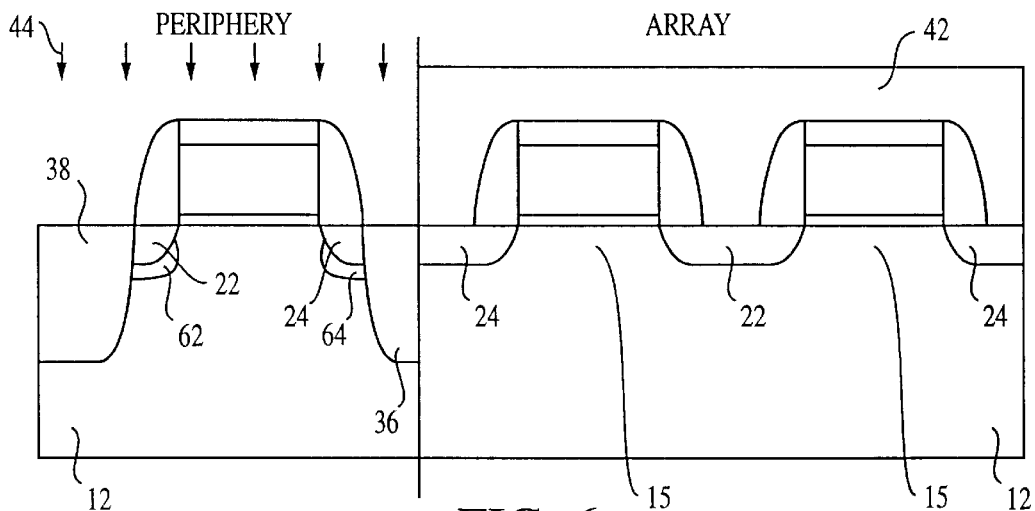
FIG. 6 is a fragmentary vertical cross sectional view of the structure of FIG. 5 at a later stage of formation.

Next, referring to FIG. 6, heavy ion implant dose 44 is accomplished by implanting into the substrate n-type (for an NMOS device) or p-type dopants (for a PMOS device) at a doping level significantly higher than the first light ion implant dose 26 used to form LDD regions 22, 24. The doping level used to form source/drain regions 36, 38 is between about $1\times10^{15}$ (1e15) to $3\times10^{15}$ (3e15) atoms per square centimeter at an energy level of between about 5–30 keV for arsenic, between about 2–20 keV for phosphorus, between about 1–20 keV for $BF_2$ or $B_2H_{10}$, or between about 0.5–5 keV for boron. In areas where heavy dose 44 overlaps LDD regions 22, 24, the heavy ion implant dose 44 overcomes the lighter doping level of the LDD regions 22, 24 and forms source/drain regions 36, 38 in the overlap area.

In the resulting device, the heavily doped source/drain regions 36, 38 have a doping concentration of between about $1.0\times10^{20}$ (1.0e20) to $5.0\times10^{20}$ (5.0e20) atoms per cubic centimeter for n-type dopants or p-type dopants.

After the heavy implant dose 44, source/drain regions 36, 38 are disposed laterally adjacent LDD regions 22, 24, which border the channel region 15. Mask 42 is then removed by processes well known in the art. A similar masking process may be repeated to form source/drain regions in p-channel devices.

Figure 7:
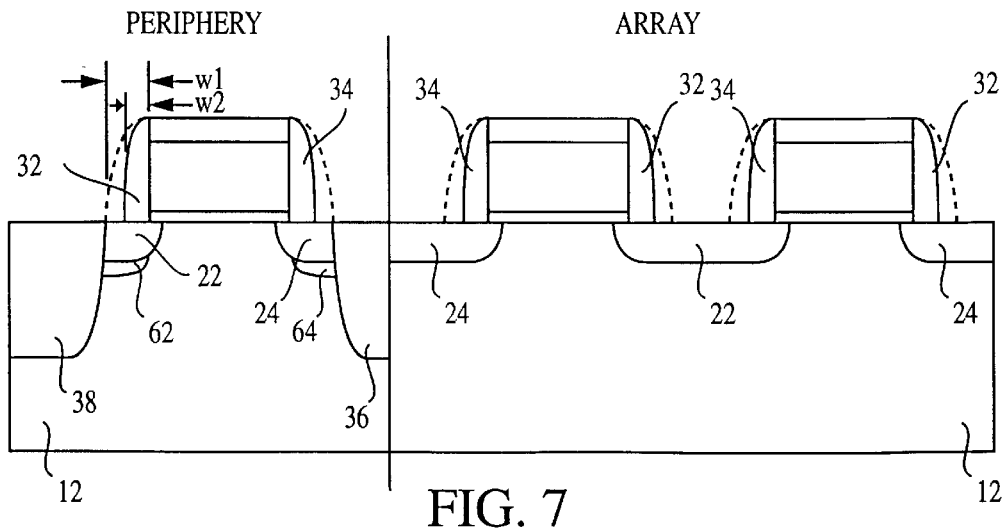
FIG. 7 is a fragmentary vertical cross sectional view of the structure of FIG. 6 at a later stage of formation.

Referring now to FIG. 7, spacers 32, 34 are next reduced in size to second width w2, in particular at their base on the substrate surface 14. The resulting spacers 32, 34 have a second width w2 of between about 25–75 percent of the first spacer width w1. This shrinking of the spacers 32, 34 is preferably accomplished by lateral or isotropically etching using a dry or wet etch, preferably with a wet etch, or using an equivalent method known in the art. Following the etching step, spacers 32, 34 overlie a portion of LDD regions 22, 24 but another portion of LDD regions 22, 24 is not so covered.

Figure 8:
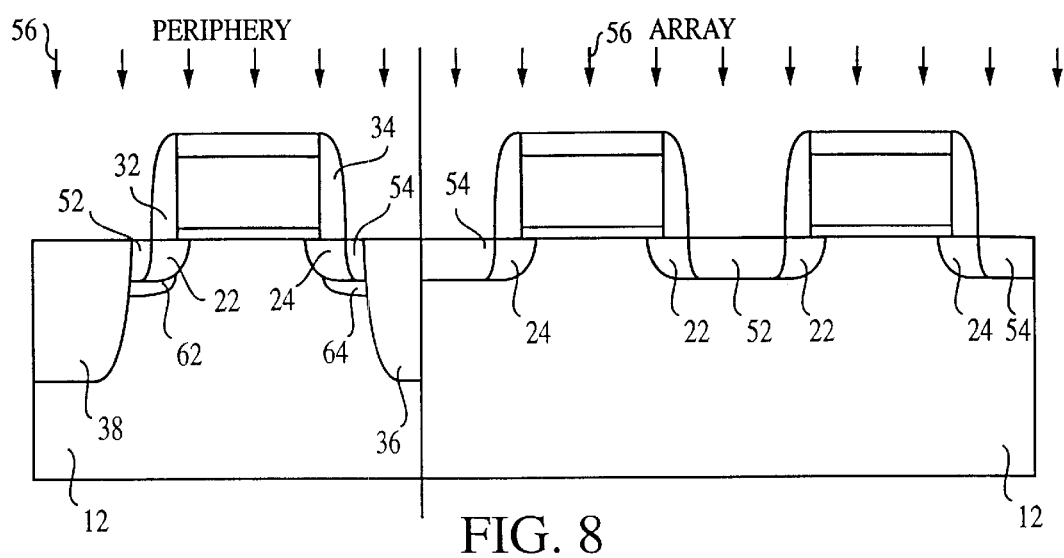
FIG. 8 is a fragmentary vertical cross sectional view of the structure of FIG. 7 at a later stage of formation.

Next, as illustrated in FIG. 8, second light ion implant dose 56 forms double LDD regions 52, 54 in the portions of the single LDD regions 22, 24 previously left uncovered by the shrinking of spacers 32, 34. Second light ion implant dose 56 adds to the doping of the substrate 12 in double LDD regions 52, 54 caused by first light ion implant dose 26. Because spacers 32, 34 effectively shield single LDD regions 22, 24 from further doping, second light dose 56 does not substantially affect those regions and instead increases the dopant concentration of the uncovered double LDD regions 52, 54.

Second light dose 56 is composed of a either a light p-type dopant, such as $BF_2$ or $B_2H_{10}$ for PMOS devices, or a light n-type dopant, preferably phosphorus for NMOS devices. The doping level used to form double LDD regions 52, 54 is between about $1 \times 10^{12}$ (1e12) to $1 \times 10^{13}$ (1e13) atoms per square centimeter at an energy of between about 1–10 keV for phosphorus or 1 keV or less for $BF_2$ or $B_2H_{10}$. This implant also goes into the array. In the resulting device, the double LDD regions 52, 54 have a doping concentration of between about $5.0 \times 10^{17}$ (5.0e17) to $4.0 \times 10^{18}$ (4.0e18) atoms per cubic centimeter for n-type dopants, or between about $8.0 \times 10^{17}$ (8.0e17) to $8.0 \times 10^{18}$ (8.0e18) atoms per cubic centimeter for p-type dopants. In the case of the NMOS memory array, the phosphorus will smooth out the storage node junctions and also prevent hot carrier degradation in the access devices that often results in shifts in threshold voltage and further degradation of the DRAM refresh.

The method of the present invention, and the apparatus formed thereof, result in several advantageous features including improved refresh characteristics of the memory array portion 11. The improvement in refresh is due to the decreased doping concentration gradient and hence electric field at the p-n junction in the access transistors of the array portion 11. In addition, decreased doping concentration and hence electric field at the p-n junction of transistors in the peripheral portion 10 results in reduced hot carrier effects and improved performance in the peripheral portion 10.

As illustrated in FIG. 9, an optional step of the method of the present invention includes, after the steps detailed above, forming in array portion 11 at least one doped polysilicon plug 82 in the gap between spacers 32, 34 and thermally annealing to outdiffuse the dopants into the substrate 12. The polysilicon plug 82 is formed on the substrate surface 14 overlying at least double LDD regions 52, 54 in the array portion 11.

The polysilicon plug 82 is formed through a series of steps known to those skilled in the art, including, for example: (1) applying an insulating layer such as BoroPhosphoSilicate Glass (BPSG) over the entire substrate or wafer, (2) pattern masking with a photoresist applied over the insulating layer to form holes in the photoresist where polysilicon plugs 82 are desired, (3) etching the insulator layer through the holes in the mask down to the surface of the substrate, (4) depositing the entire wafer with polysilicon, preferably in-situ doped polysilicon (5) optionally doping the polysilicon to make it conductive, and (6) the polysilicon layer may be dry etched back, leaving the polysilicon plugs 82, and optionally chemical-mechanical polishing (CMP) may be used to planarize the polysilicon layer, leaving the polysilicon plugs 82 in the previously etched holes. The polysilicon plug 82 is preferably doped to a level between about $1 \times 10^{19}$ (1e19) to $1 \times 10^{21}$ (1e21) atoms per cubic centimeter ($cm^3$) and annealed at temperatures and durations well known in the art.

Figure 10:
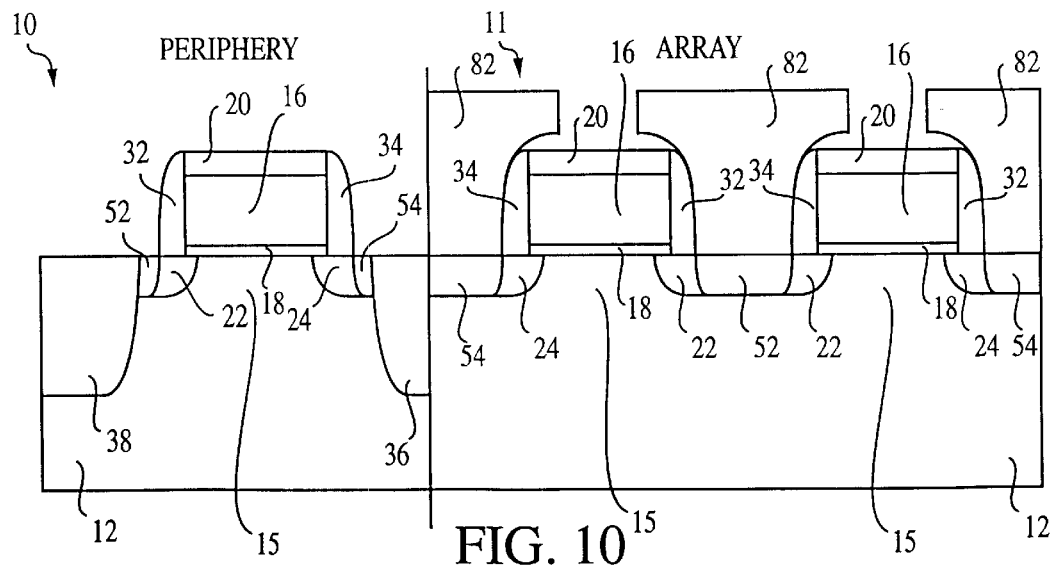
FIG. 10 is a fragmentary vertical cross sectional view of an integrated circuit device in accordance with a first alternate embodiment of the present invention.

In a first alternate embodiment of the method and apparatus of the present invention, the halo implant step 66 shown in FIG. 5 may be omitted. The method thus progresses from the formation of spacers 32, 34, as shown in FIG. 4, directly to the heavy implant dose 44, as shown in FIG. 6. The resulting device structure is illustrated in FIG. 10. Note that halo implant regions 62, 64 are not present in periphery portion 10 in FIG. 10. Nothing is changed in the array portion 11, since it was protected by mask 42 from the halo implant step 66.

Figure 18:
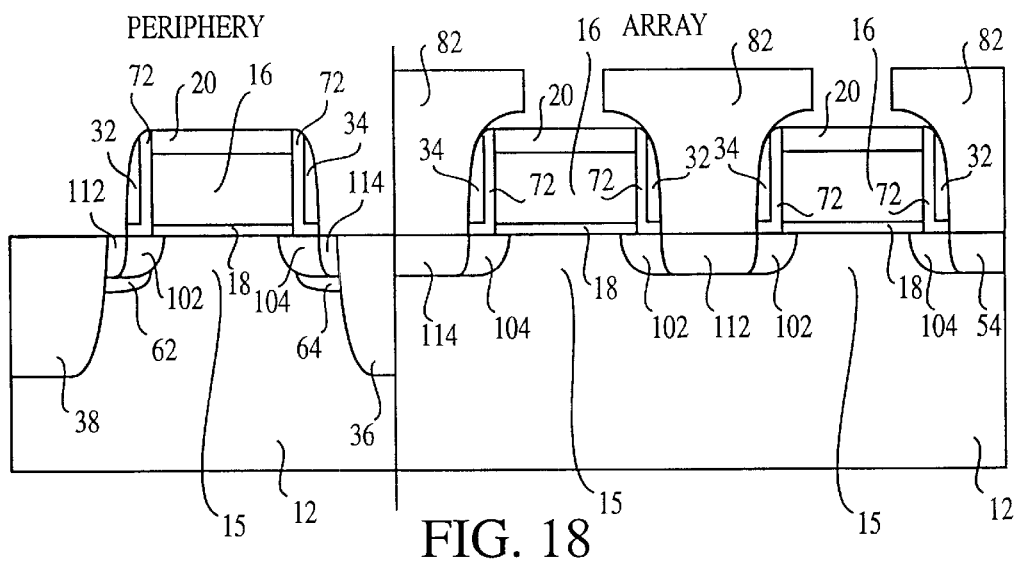
FIG. 18 is a fragmentary vertical cross sectional view of the structure of FIG. 17 at a later stage of formation.

FIG. 18 illustrates the apparatus of a second alternate embodiment of the present invention. For the apparatus of the second alternate embodiment, FIG. 18 shows an array portion 11 and a periphery portion 10 of a memory circuit in which the single LDD regions 102, 104 are more lightly doped than the single LDD regions 22, 24 shown in FIG. 9 due to the formation of a thin dielectric layer 72 prior to the first light implant step (see method discussion below). Similarly, more lightly doped double LDD regions 112, 114 are formed adjacent the single LDD regions 102, 104, resulting in still lesser gradients at the p-n junctions both in the array 11 and periphery 10 portions.

Figure 11:
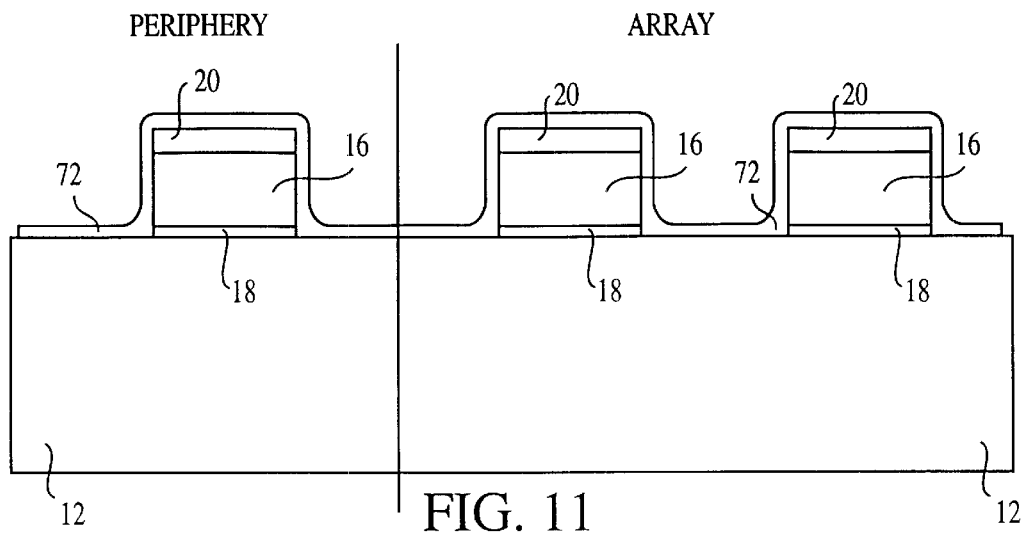
FIG. 11 is a fragmentary vertical cross sectional view of an integrated circuit device at an early stage of formation in accordance with a second alternate embodiment of the present invention.

FIGS. 11–18 illustrate the method of a second alternate embodiment of the present invention. A dielectric layer 72 is formed on the gate structure formed on the substrate surface 14 before any of the ion implantation steps of the above described method are conducted. Referring now to FIG. 11, after the gate 16, the gate top insulator 20 and gate oxide 18 are formed, a dielectric layer 72 is formed on the top of the gate top insulator 20 and on the exposed areas of the substrate surface 14. The thickness of dielectric layer 72 is between about 25–50 percent of the first width w1 of the subsequently-formed spacers 32, 34, or preferably between about 30–200 angstroms. The dielectric layer 72 may be composed of a variety of nonconductive materials well known in the art, such as oxide, nitride, or oxynitride, but preferably it is composed of tetraethylorthosilicate (TEOS).

Figure 12:
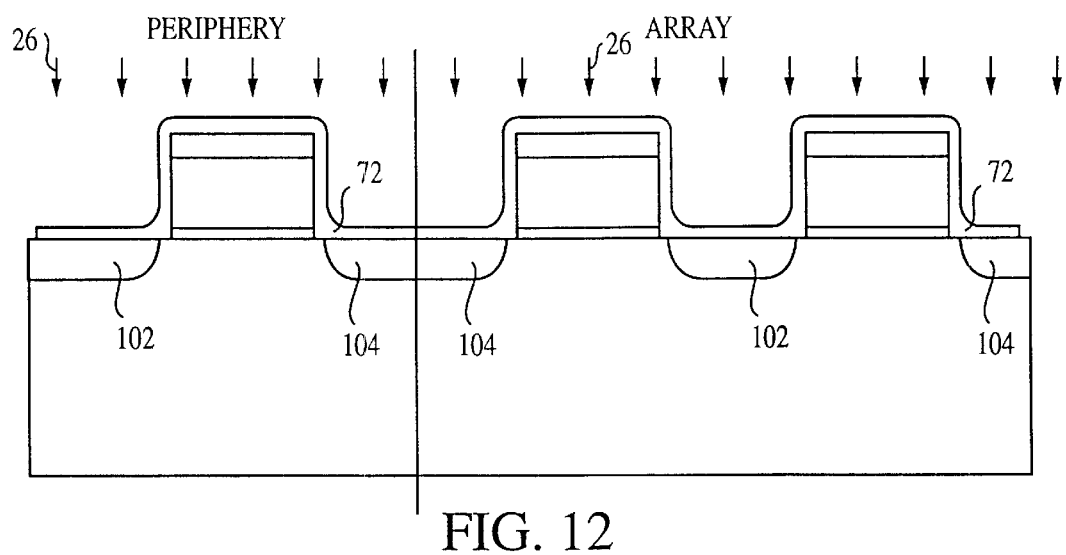
FIG. 12 is a fragmentary vertical cross sectional view of the structure of FIG. 11 at a later stage of formation.

After dielectric layer 72 is formed, the method proceeds as illustrated in FIGS. 12–18 in an analogous fashion to the previous method discussion accompanying FIGS. 3–9. The second alternate embodiment differs in that first light ion implant dose 26 is conducted to implant the dose into the substrate 12 through the dielectric layer 72, as illustrated in FIG. 12. Because the dielectric layer 72 partially impedes the penetration of dopant ions into the substrate 12, the resulting dopant concentration in the target region is lower than if the dielectric layer 72 were not present for an identical doping and energy level. Thus, the resulting dopant concentration in LDD regions 102 and 104 is less than that of single LDD regions 22, 24 in the preferred embodiment. The dielectric layer 72 also spaces the LDD implant away from the channel region.

Depending on the pre-existing doping of the substrate 12, the second alternate embodiment can provide an improved (lesser) doping concentration gradient at the p-n junction adjacent the channel 15 for both the array 11 and the periphery 10. This results in improved (lesser) junction leakage and lesser hot carrier effects.

Figure 13:
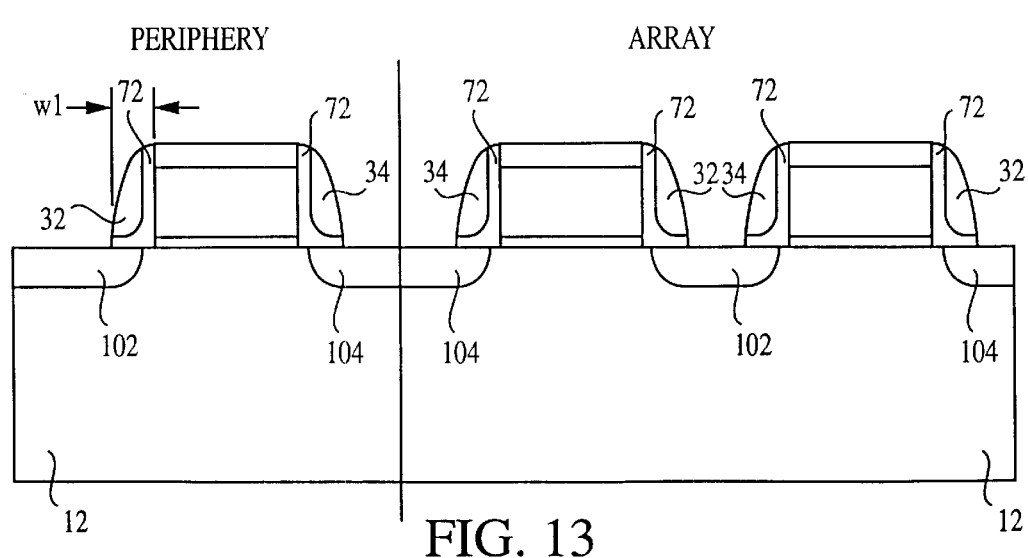
FIG. 13 is a fragmentary vertical cross sectional view of the structure of FIG. 12 at a later stage of formation.
Figure 14:
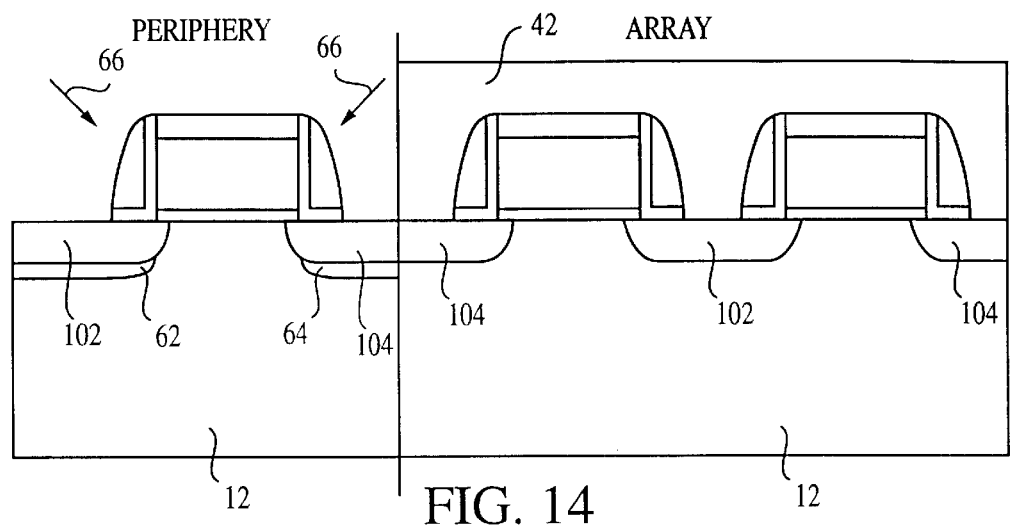
FIG. 14 is a fragmentary vertical cross sectional view of the structure of FIG. 13 at a later stage of formation.
Figure 15:
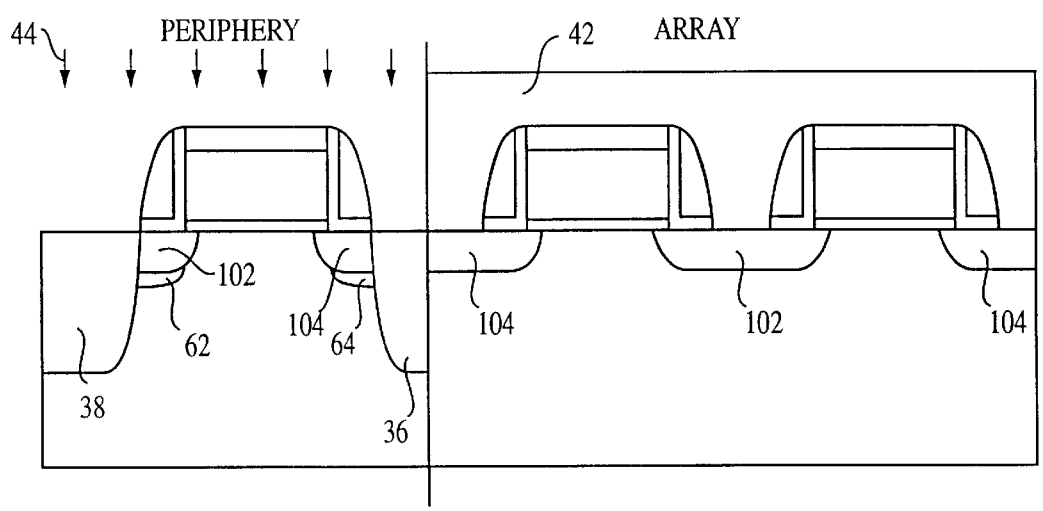
FIG. 15 is a fragmentary vertical cross sectional view of the structure of FIG. 14 at a later stage of formation.
Figure 16:
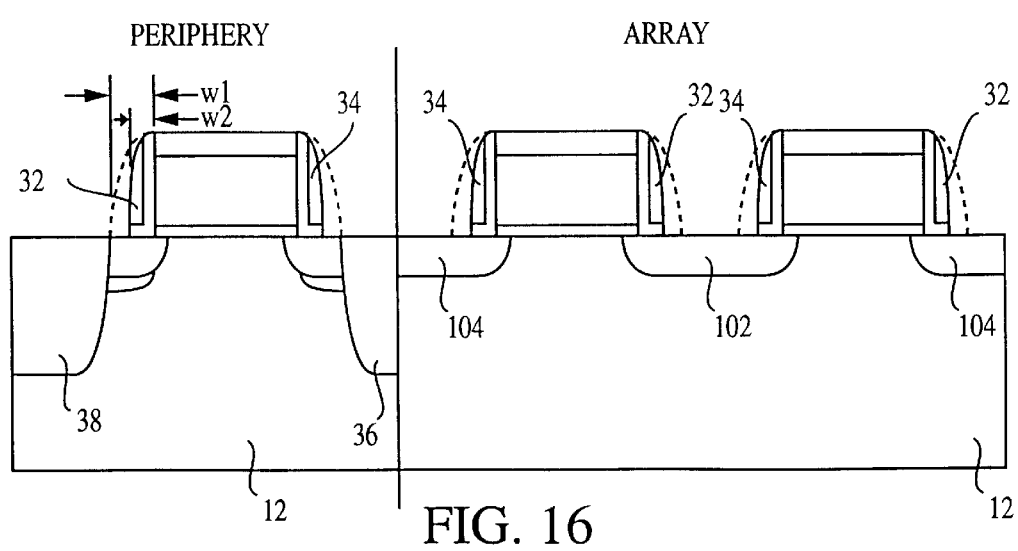
FIG. 16 is a fragmentary vertical cross sectional view of the structure of FIG. 15 at a later stage of formation.
Figure 17:
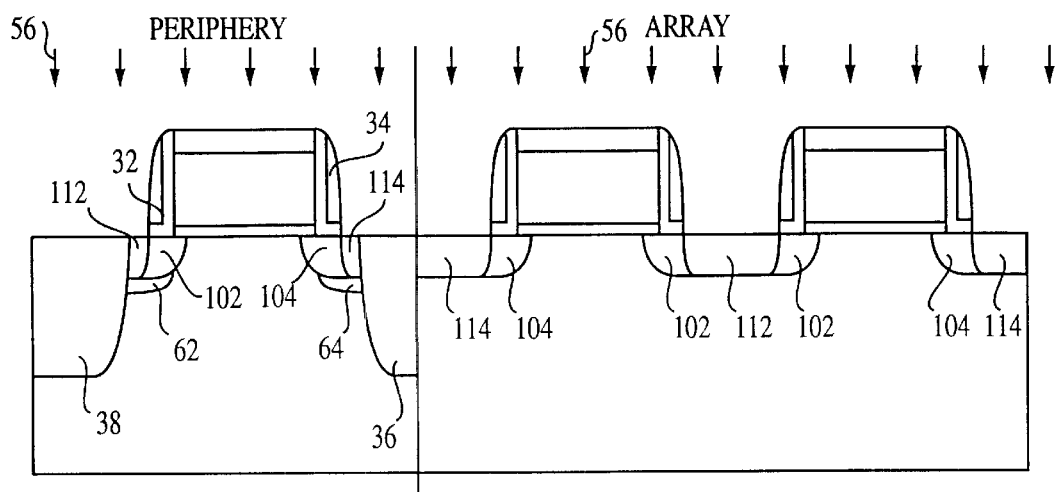
FIG. 17 is a fragmentary vertical cross sectional view of the structure of FIG. 16 at a later stage of formation.
Figure 19:
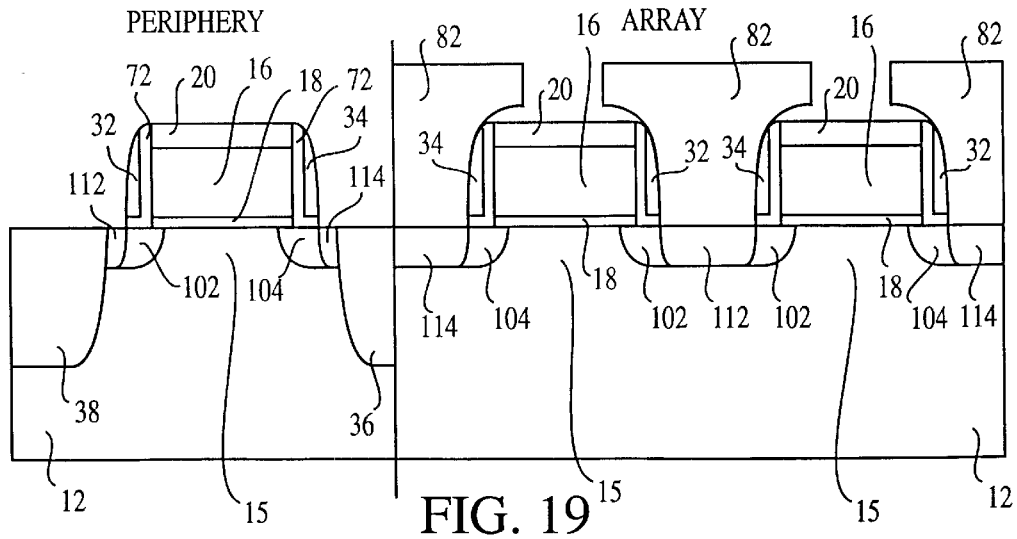
FIG. 19 is a fragmentary vertical cross sectional view of an integrated circuit device at an early stage of formation in accordance with a third alternate embodiment of the present invention.
Figure 35:
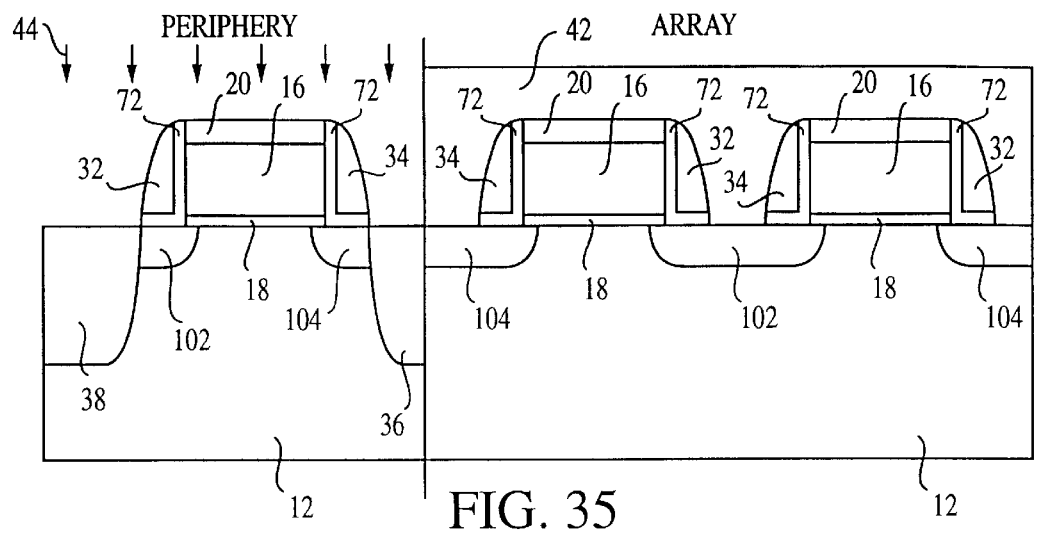
FIG. 35 is a fragmentary vertical cross sectional view of an integrated circuit device at an early stage of formation in accordance with an embodiment of the present invention.
Figure 36:
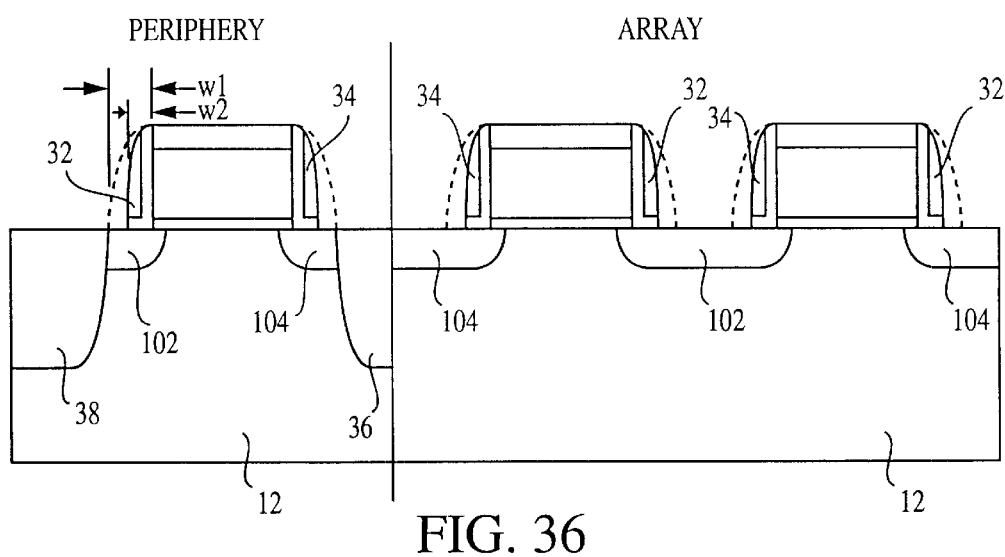
FIG. 36 is a fragmentary vertical cross sectional view of the structure of FIG. 35 at a later stage of formation.
Figure 37:
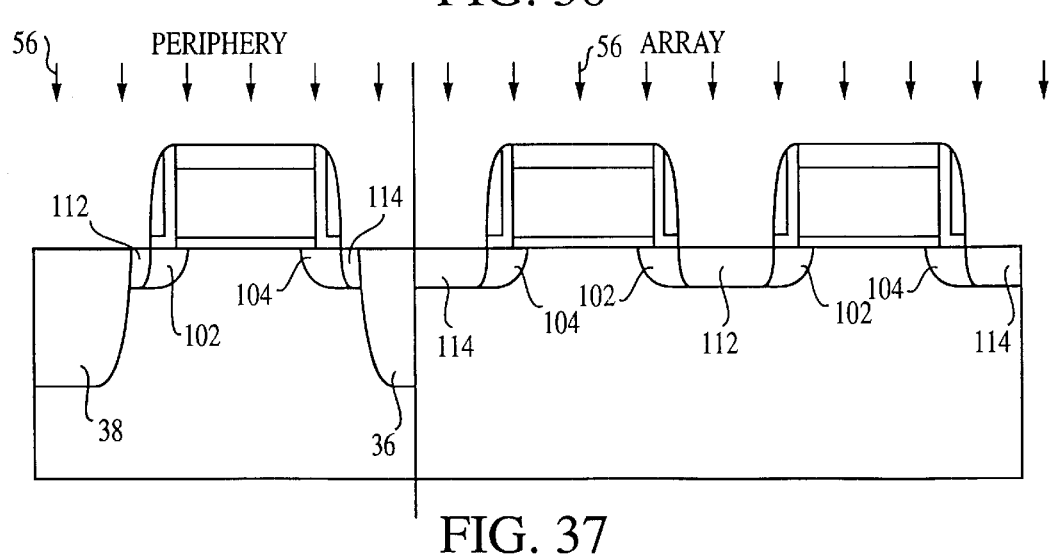
FIG. 37 is a fragmentary vertical cross sectional view of the structure of FIG. 36 at a later stage of formation.

In a third alternate embodiment of the method and apparatus of the present invention, the halo implant step 66 shown in FIG. 14 may be omitted. The method thus progresses from the formation of spacers 32, 34, as shown in FIG. 13, directly to the heavy implant dose 44, as shown in FIG. 35. FIGS. 36 and 37 show the etching of spacers 32, 34 back to a second width w2, and application of implant 56. The resulting device structure is illustrated in FIG. 19. Note that halo implant regions 62, 64 are not present in periphery portion 10 in FIGS. 35–37 and 19. The sequence of this embodiment forms a smooth gradient between channel and drain without using halo implant 66.

Figure 28:
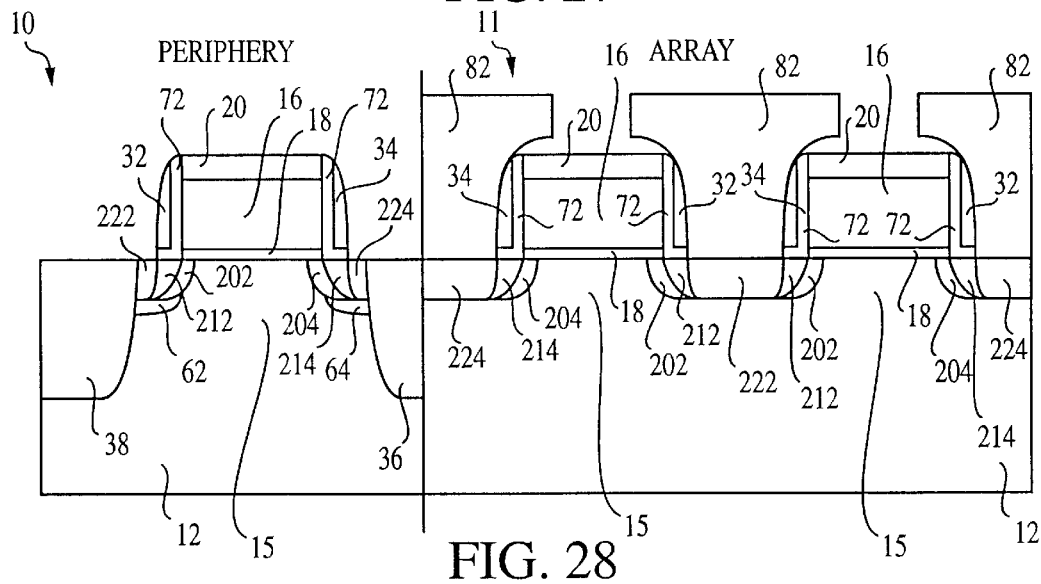
FIG. 28 is a fragmentary vertical cross sectional view of the structure of FIG. 27 at a later stage of formation.

FIG. 28 illustrates the apparatus of a fourth alternate embodiment of the present invention. For the apparatus of the fourth alternate embodiment, FIG. 28 shows a memory circuit having an array portion 11 and a peripheral portion 10 with triple LDD regions 222, 224 in addition to double LDD regions 212, 214 and single LDD regions 202, 204. Triple LDD regions 222, 224 result from a blanket implant step 25 performed prior to the steps used to form the second alternate embodiment, as described in more detail below.

FIGS. 20–28 illustrate the method of a fourth alternate embodiment of the present invention. Similar to the second alternate embodiment described above, a dielectric layer 72 is formed on the gate structure and on the substrate surface 14 to partially impede the doping of the underlying substrate 12. In contrast to the second alternate embodiment, prior to the formation of dielectric layer 72, a blanket light ion implant step 25 is conducted, forming lightly doped regions 202, 204 in the substrate 12, both in the array 11 and the periphery 10. The method then proceeds similar to the second alternate embodiment, resulting in single, double and triple LDD regions surrounding the channel 15 in both the array 11 and the periphery 10.

For an NMOS device, an n-type dopant is used for blanket light ion implant step 25, such as arsenic, phosphorus or antimony. For a PMOS device, a p-type dopant is used, such as boron, $BF_2$ or $B_2H_{10}$. A light doping and energy level is used to create the single lightly doped regions 202 and 204, such as a doping level of between about $1 \times 10^{12}$ (1e12) to $2 \times 10^{13}$ (2e13) atoms per square centimeter at an energy of between about 5–50 keV for arsenic, between about 2–20 keV for phosphorus, or 1 keV or less for p-type dopants. In the resulting device, the single LDD regions 202, 204 have a doping concentration of between about $5.0 \times 10^{17}$ (5.0e17) to $4.0 \times 10^{18}$ (4.0e18) atoms per cubic centimeter for n-type dopants, or between about $8.0 \times 10^{17}$ (8.0e17) to $8.0 \times 10^{18}$ (8.0e18) atoms per cubic centimeter for p-type dopants.

Figure 20:
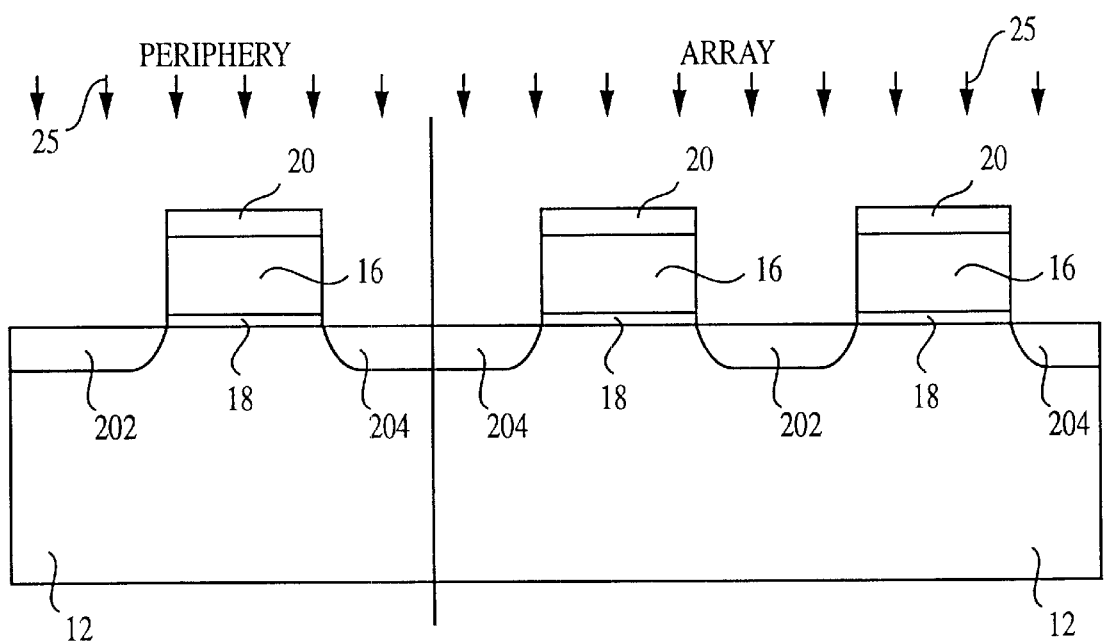
FIG. 20 is a fragmentary vertical cross sectional view of an integrated circuit device at an early stage of formation in accordance with a fourth alternate embodiment of the present invention.
Figure 21:
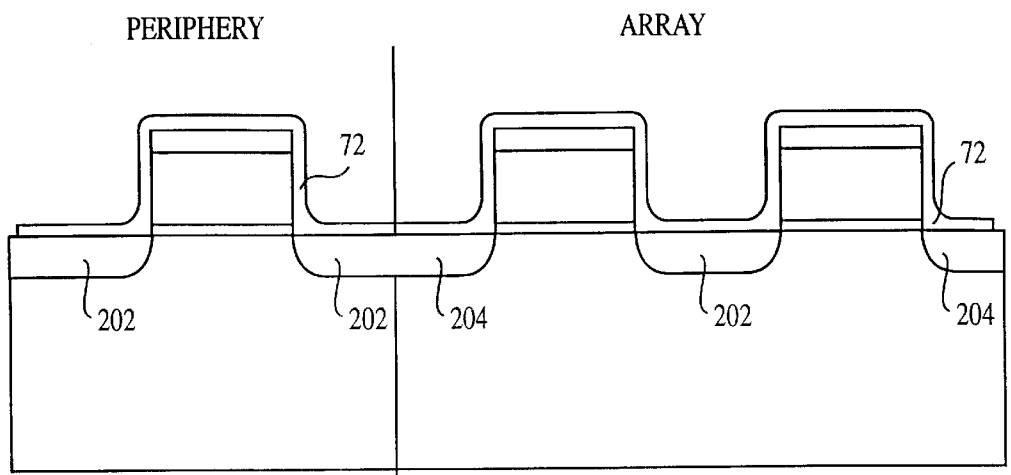
FIG. 21 is a fragmentary vertical cross sectional view of the structure of FIG. 20 at a later stage of formation.

Referring now to FIG. 20, a blanket light ion implant 25 similar to that illustrated in FIG. 3 is performed in the array 11 and the periphery 10. Next, as shown in FIG. 21, dielectric layer 72 is formed on the top of the gate top insulator 20 and on the exposed areas of the substrate surface 14. Similar to the second alternate embodiment, the thickness of dielectric layer 72 is between about 25–50 percent of the first width w1 of the subsequently-formed spacers 32, 34, or preferably between about 30–200 angstroms for a spacer width of 400 angstroms. The dielectric layer 72 may be composed of a variety of nonconductive materials well known in the art, such as oxide, nitride, or oxynitride, but preferably it is composed of tetraethylorthosilicate (TEOS).

Figure 26:
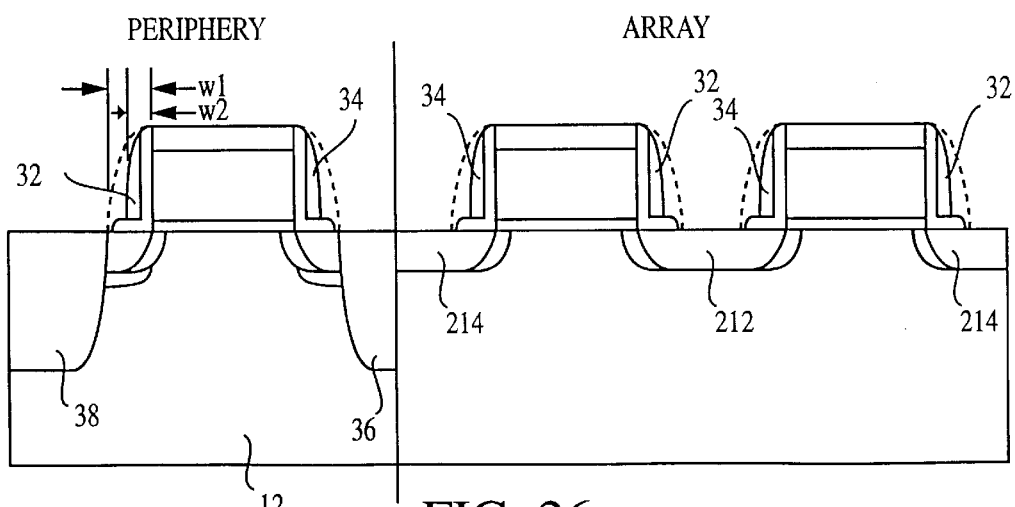
FIG. 26 is a fragmentary vertical cross sectional view of the structure of FIG. 25 at a later stage of formation.

The dielectric layer 72 may be composed of a material different from that of the dielectric spacers 32, 34, which are formed later. Like the dielectric layer 72, the spacers 32, 34 may be formed from a nonconductive material such as an oxide, nitride, or oxynitride, and preferably tetraethylorthosilicate (TEOS), but it is not required that the spacers 32, 34 be formed from the same material as the dielectric layer 72. However, if the dielectric layer 72 is composed of a different material from the spacers 32, 34, the spacer etch back may leave a "foot," as shown in FIG. 26.

Figure 27:
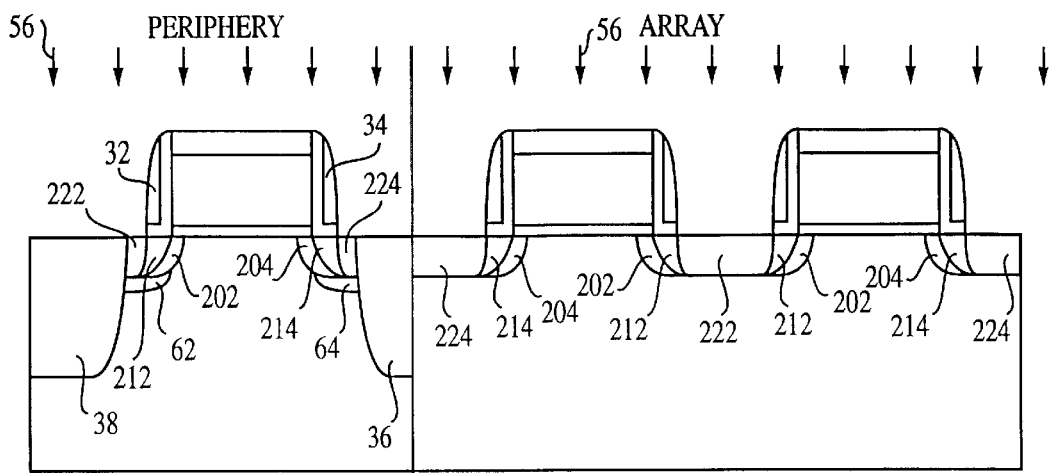
FIG. 27 is a fragmentary vertical cross sectional view of the structure of FIG. 26 at a later stage of formation.

After dielectric layer 72 is formed, the method proceeds as illustrated in FIGS. 22–28 in an analogous fashion to the previous methods discussions accompanying FIGS. 3–9 and FIGS. 12–18. The fourth alternate embodiment differs from previous embodiments in that further stratification of the doping profile using single, double and triple lightly doped regions is accomplished adjacent the channel 15. As shown in FIGS. 27 and 28, in the periphery 10, three levels of light doping appear between source/drain regions 36, 38 and channel 15, including single lightly doped LDD regions 202, 204, double lightly doped LDD regions 212, 214, and triple lightly doped LDD regions 222, 224. In the array, adjacent the channel are single lightly doped regions 202, 204, double LDD regions 212, 214 and triple LDD regions 222, 224 which underlie conductive plugs 82. In the resulting devices, the triple LDD regions 222, 224 have a doping concentration of between about $1.0 \times 10^{18}$ (1.0e18) to $4.0 \times 10^{18}$ (4.0e18) atoms per cubic centimeter for n-type dopants, or between about $8.0 \times 10^{17}$ (8.0e17) to $8.0 \times 10^{18}$ (8.0e18) atoms per cubic centimeter for p-type dopants.

Depending on the pre-existing doping of the substrate 12, the fourth alternate embodiment provides an improved doping concentration gradient at the p-n junction adjacent the channel 15 in both the array and periphery due to the further stratification of the doping concentration profile. The resulting device exhibits a lesser E-field at the p-n junction resulting in decreased junction leakage and lesser incidence of hot carrier effects.

Figure 24:
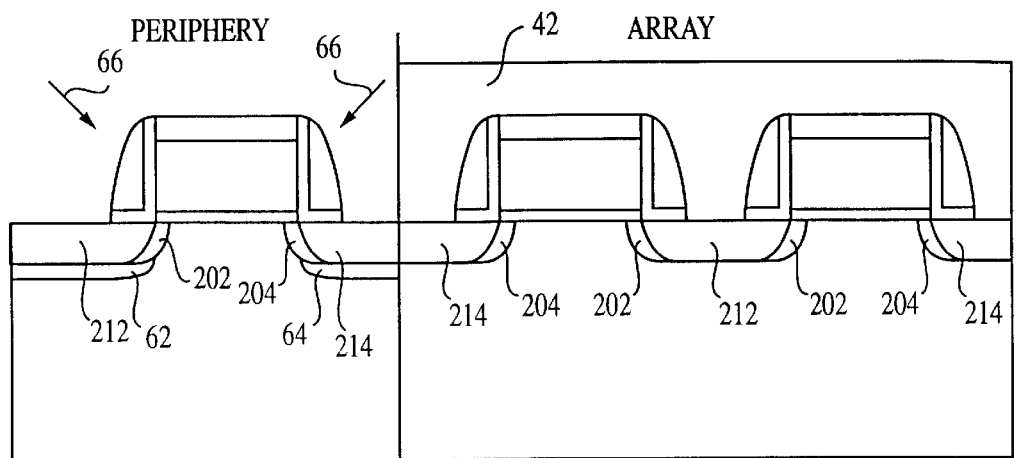
FIG. 24 is a fragmentary vertical cross sectional view of the structure of FIG. 23 at a later stage of formation.
Figure 25:
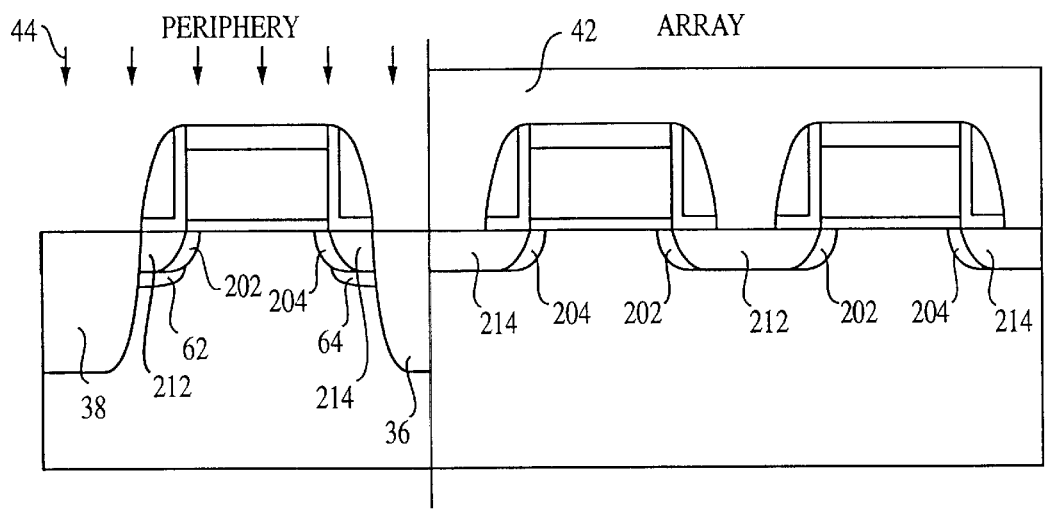
FIG. 25 is a fragmentary vertical cross sectional view of the structure of FIG. 24 at a later stage of formation.
Figure 31:
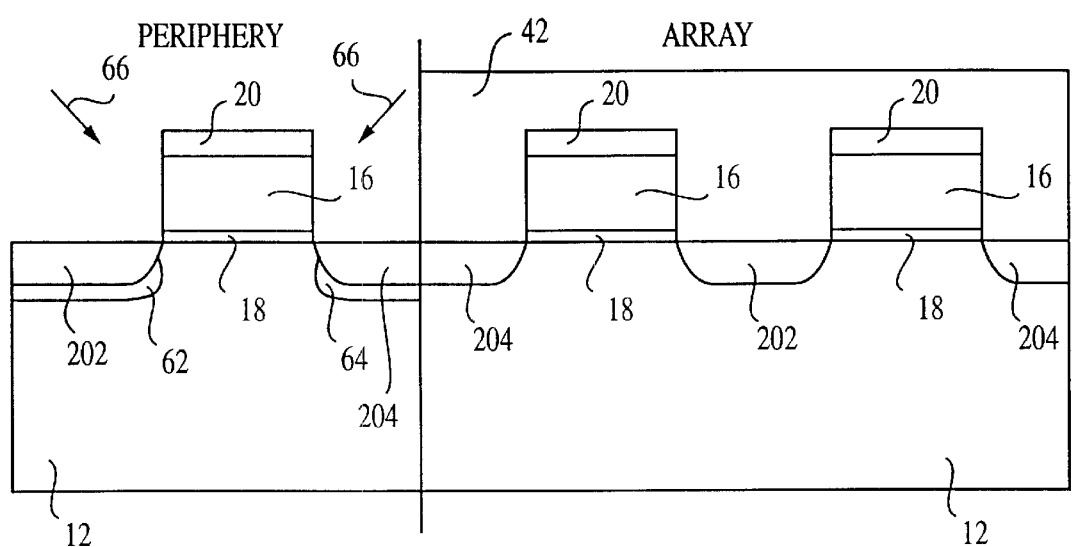
FIG. 31 is a fragmentary vertical cross sectional view of an integrated circuit device at an early stage of formation in accordance with an embodiment of the present invention.
Figure 32:
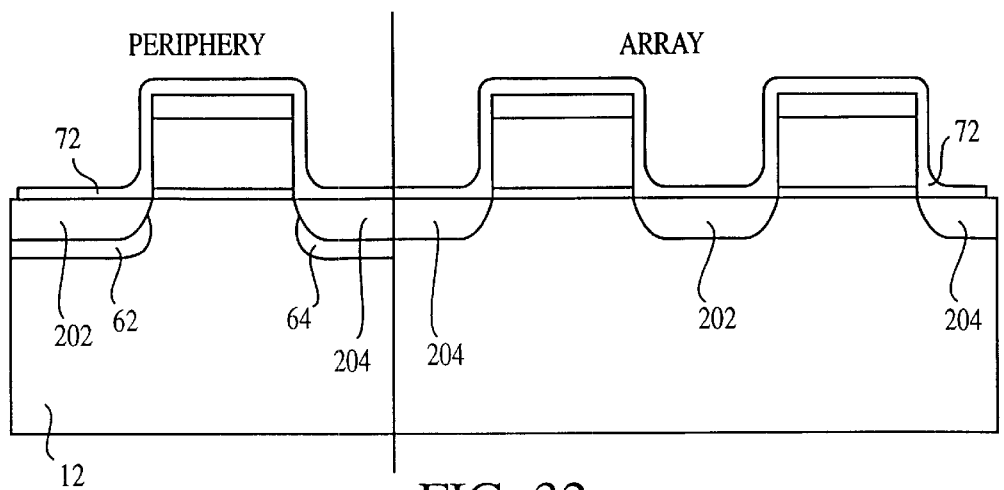
FIG. 32 is a fragmentary vertical cross sectional view of the structure of FIG. 31 at a later stage of formation.
Figure 33:
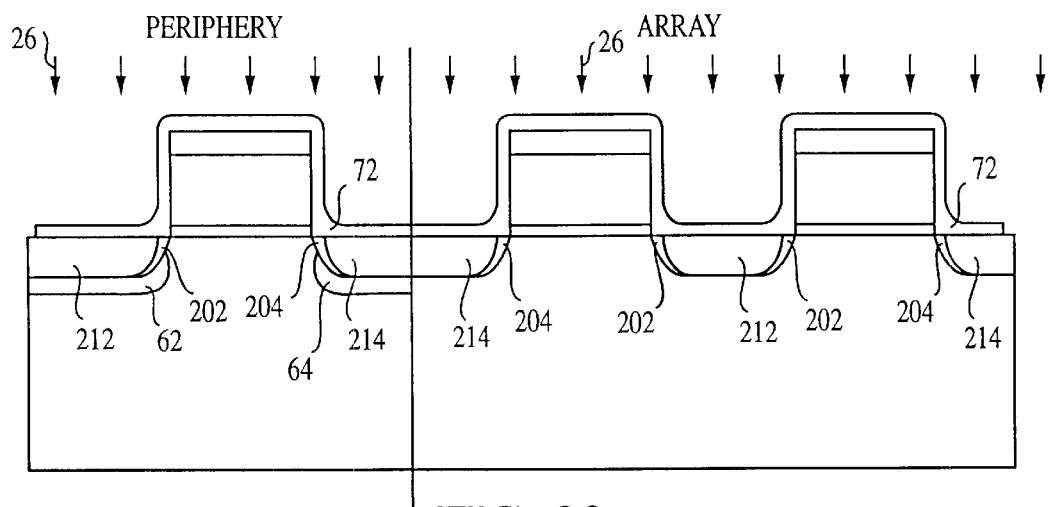
FIG. 33 is a fragmentary vertical cross sectional view of the structure of FIG. 32 at a later stage of formation.
Figure 34:
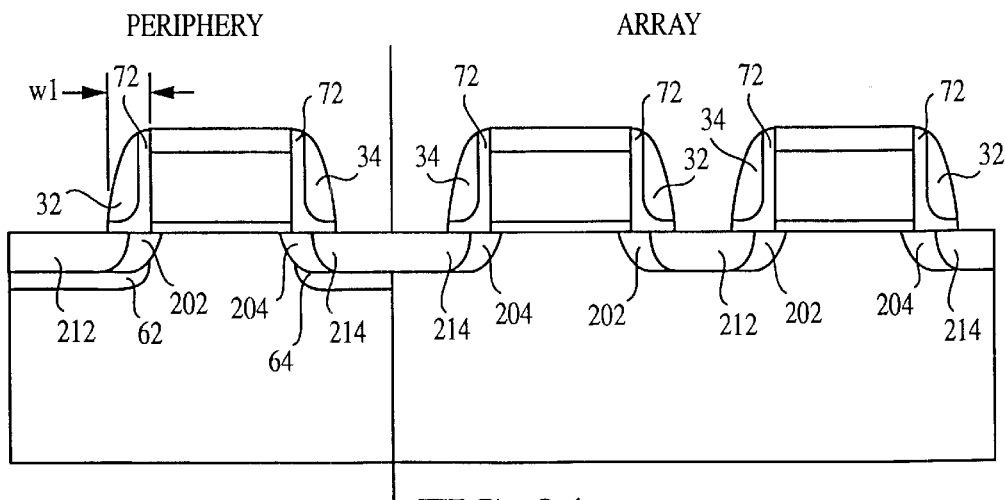
FIG. 34 is a fragmentary vertical cross sectional view of the structure of FIG. 33 at a later stage of formation.

In other embodiments of the method and apparatus of the invention, the halo implant step 66 may be performed at other time in the sequence prior to that illustrated in FIG. 24. For example, the halo implant 66 may be performed prior to formation of the double lightly doped regions 212, 214 and prior to or simultaneously with formation of the single lightly doped regions 202, 204. FIGS. 31–34 illustrate a sequence of method steps for this embodiment that occur after or at the same time as that shown in FIG. 20. FIG. 31 shows the application of the halo implant 66 while masking with mask 42 the array and other portions of the die not intended to be implanted. FIG. 32 shows the formation of dielectric layer 72 in both the periphery and the array. FIG. 33 shows application of second light LDD implant 26 to form double lightly doped regions 212, 214. Spacers 32, 34 are then formed adjacent the gate structures and the remainder of dielectric layer 72 covering the substrate is removed, as shown in FIG. 34. The sequence proceeds as shown in FIG. 25–27 to produce the resulting structure shown in FIG. 28.

Figure 22:
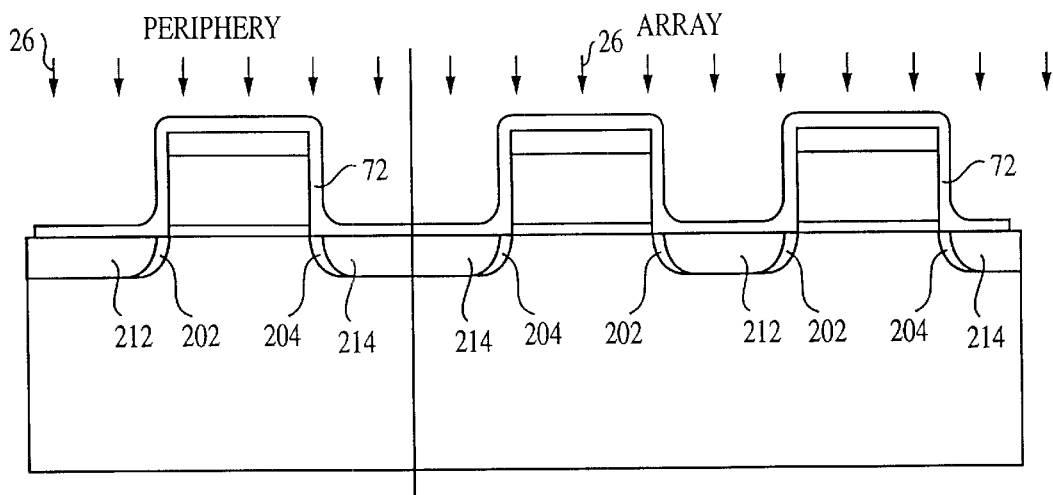
FIG. 22 is a fragmentary vertical cross sectional view of the structure of FIG. 21 at a later stage of formation.
Figure 23:
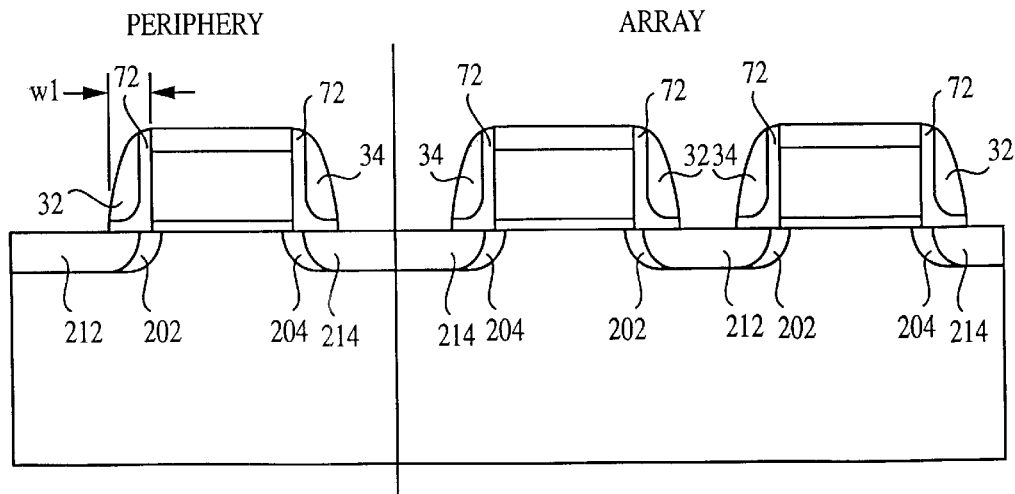
FIG. 23 is a fragmentary vertical cross sectional view of the structure of FIG. 22 at a later stage of formation.
Figure 29:
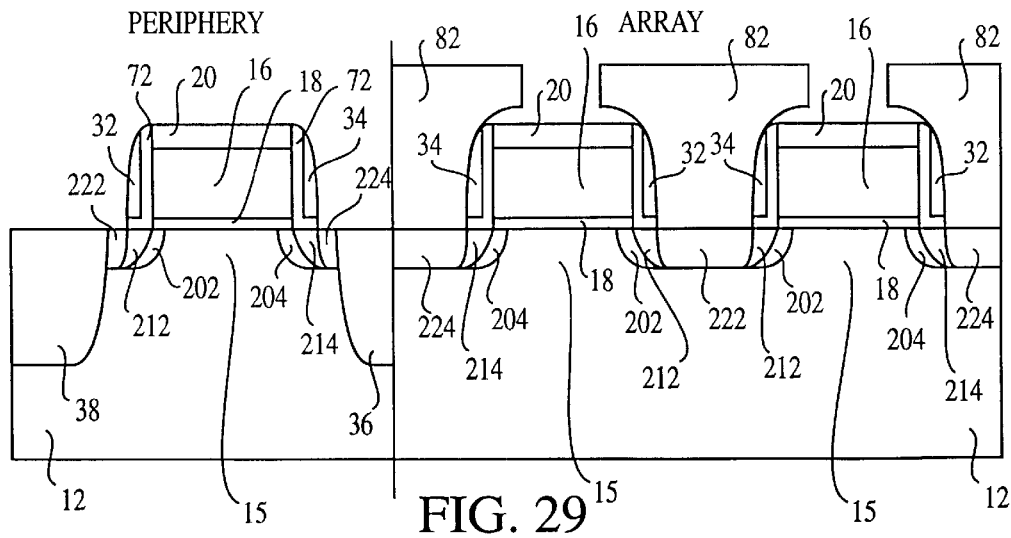
FIG. 29 is a fragmentary vertical cross sectional view of an integrated circuit device at an early stage of formation in accordance with a fifth alternate embodiment of the present invention.

In a fifth alternate embodiment of the method and apparatus of the present invention, the halo implant step 66 shown in FIG. 24 may be omitted. The method thus progresses from the formation of spacers 32, 34, as shown in FIG. 23, directly to the heavy implant dose 44, as shown in FIG. 25. The resulting device structure is illustrated in FIG. 29. Note that halo implant regions 62, 64 are not present in periphery portion 10 in FIG. 29. Nothing is changed in the array portion 11, since it was protected by mask 42 from the halo implant dose 66. The multiple lightly doped regions may thus serve as a substitute for the halo implant 66 if each LDD implant is performed in a blanket fashion (i.e., without a mask) as shown in FIGS. 20, 22 and 27.

Figure 30:
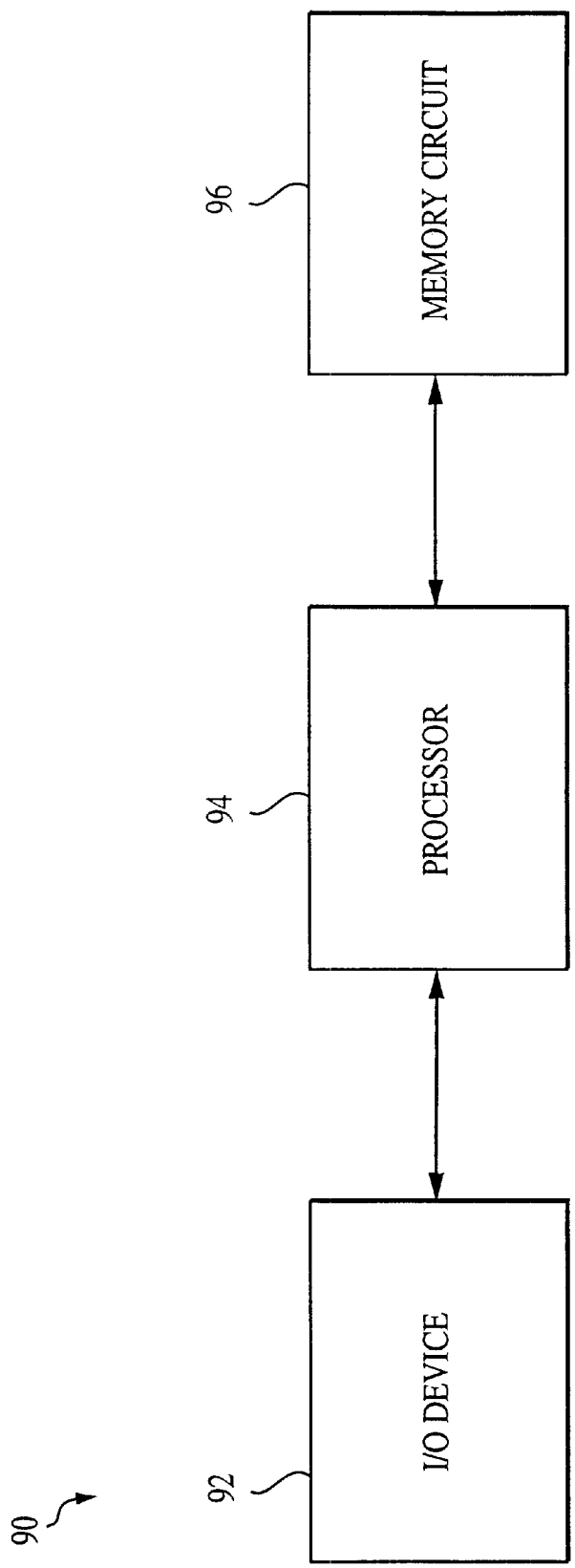
FIG. 30 is block diagram of a processor-based system including a semiconductor device formed in accordance with the present invention.

FIG. 30 illustrates a processor-based system 90, e.g. a computer system, according to one embodiment of the present invention. The processor-based system 90 comprises a CPU (central processing unit) 94, a memory circuit 96, and an I/O (input/output) device 92. The memory circuit 96 contains a DRAM memory circuit formed in accordance with the present invention. Memory other than DRAM may be used. Also, the CPU 94 may itself be an integrated processor which utilizes embedded DRAM semiconductor devices formed in accordance with the present invention.

As illustrated in the preceding discussion and accompanying figures, the method and apparatus of the present invention provide an improvement in the state of the art for semiconductor devices and methods for their formation. The present invention provides a series of lightly doped regions to attenuate sharp discontinuities of doping concentration between source, channel and drain regions. These improvements reduce unwanted junction leakage at the p-n junction for a memory array and reduce hot carrier effects in peripheral devices using conventional techniques of manufacturing and wafer processing.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. An integrated circuit device in a memory array, comprising:
    a gate structure formed on and supported by a memory array portion of a substrate;
    a channel region formed in said substrate in said array portion;
    a single lightly doped region formed in said substrate in said array portion adjacent said channel region;
    a double lightly doped region formed in said substrate in said array portion adjacent said single lightly doped region, wherein said single lightly doped region lies between said double lightly doped region and said channel region; and
    a triple lightly doped region formed in said substrate adjacent said double lightly doped region, wherein said double lightly doped region lies between said single lightly doped region and said triple lightly doped region.

2. The integrated circuit device of claim 1, further comprising a conductive plug overlying at least said double lightly doped region.

3. The integrated circuit device of claim 1, further comprising a conductive plug overlying at least said triple lightly doped region.

4. A memory device, comprising:
    a substrate including an array portion and a periphery portion;
    at least two gate structures formed on and supported by said substrate, wherein at least one gate structure is formed in each of said array portion and said periphery portion;
    dielectric spacers formed on opposite sides of said gate structures;
    at least two channel regions formed in said substrate below said gate structures, wherein each said gate structure controls charge carriers in a respective channel region;
    single lightly doped regions formed in said substrate on opposite sides of each said respective channel region;
    double lightly doped regions formed in said substrate adjacent each of said single lightly doped regions, wherein one of said single lightly doped regions lies between one of said double lightly doped regions and said respective channel region;
    heavily-doped regions formed in said substrate in said periphery portion, wherein one of said single lightly doped regions and one of said double lightly doped regions lie between each of said heavily-doped regions and said respective channel region; and
    triple lightly doped regions formed in said substrate adjacent said double lightly doped regions, wherein one of said double lightly doped regions lies between one of said single lightly doped regions and one of said triple lightly doped regions.

5. The memory device of claim 4, further comprising halo implant regions formed in said substrate in said periphery portion, wherein one of said halo implant regions lies between one of said single lightly doped regions and said respective channel region.

6. The memory device of claim 4, further comprising at least one conductive plug formed in said array portion adjacent at least one of said spacers, wherein said conductive plug overlies one of said double lightly doped regions.

7. The memory device of claim 4, further comprising at least one conductive plug formed in said array portion adjacent at least one of said spacers, wherein said conductive plug overlies one of said triple lightly doped regions.

8. A processor-based system, comprising:
    a processor;
    an integrated memory circuit connected to said processor, said memory circuit comprising:
        a gate structure formed on and supported by a memory array portion of a substrate;
        a channel region formed in said substrate in said array portion;
        a single lightly doped region formed in said substrate in said array portion adjacent said channel region;
        a double lightly doped region formed in said substrate in said array portion adjacent said single lightly doped region, wherein said single lightly doped region lies between said double lightly doped region and said channel region; and
        a triple lightly doped region formed in said substrate adjacent said double lightly doped region, wherein said double lightly doped region lies between said single lightly doped region and said triple lightly doped region.

9. The processor-based system of claim 8, further comprising a conductive plug overlying at least said double lightly doped region.

10. The processor-based system of claim 8, further comprising a conductive plug overlying at least said triple lightly doped region.

11. A processor-based system, comprising:
    a processor;
    an integrated memory circuit connected to said processor, said memory circuit comprising:
        a substrate including an array portion and a periphery portion;
        at least two gate structures formed on and supported by said substrate, wherein at least one gate structure is formed in each of said array portion and said periphery portion;
        dielectric spacers formed on and supported by said substrate on opposite sides of said gate structures;
        at least two channel regions formed in said substrate, wherein each said gate structure controls charge carriers in a respective channel region;
        single lightly doped regions formed in said substrate on opposite sides of each said respective channel region;
        double lightly doped regions formed in said substrate adjacent each of said single lightly doped regions, wherein one of said single lightly doped regions lies between one said double lightly doped regions and said respective channel region;

triple lightly doped regions formed in said substrate adjacent said double lightly doped regions, wherein one of said double lightly doped regions lies between one of said single lightly doped regions and one of said triple lightly doped regions; and heavily-doped regions formed in said substrate in said periphery portion, wherein one of said single lightly doped regions one of said double lightly doped regions and one of said triple lightly doped regions lie between each of said heavily-doped regions and said respective channel region.

12. An embedded-memory processor-based system, comprising:

a processor;

a memory circuit formed on a same integrated circuit as said processor, said memory circuit comprising:

a gate structure formed on and supported by a memory array portion of a substrate;

a channel region formed in said substrate in said array portion;

a single lightly doped region formed in said substrate in said array portion adjacent said channel region;

a double lightly doped region formed in said substrate in said array portion adjacent said single lightly doped region, wherein said single lightly doped region lies between said double lightly doped region and said channel region; and a triple lightly doped region formed in said substrate adjacent said double lightly doped region, wherein said double lightly doped region lies between said single lightly doped region and said triple lightly doped region.

13. The embedded-memory processor-based system of claim 12, further comprising a conductive plug overlying at least said double lightly doped region.

14. The embedded-memory processor-based system of claim 12, further comprising a conductive plug overlying at least said triple lightly doped region.

15. An embedded-memory processor based system, comprising:

a processor;

a memory circuit formed on a same integrated circuit as said processor, said memory circuit comprising:

a substrate including an array portion and a periphery portion;

at least two gate structures formed on and supported by said substrate, wherein at least one gate structure is formed in each of said array portion and said periphery portion;

dielectric spacers formed on and supported by said substrate on opposite sides of said gate structures;

at least two channel regions formed in said substrate, wherein each said gate structure controls charge carriers in a respective channel region;

single lightly doped regions formed in said substrate on opposite sides of each said respective channel region;

double lightly doped regions formed in said substrate adjacent each of said single lightly doped regions, wherein one of said single lightly doped regions lies between one said double lightly doped regions and said respective channel region;

triple lightly doped regions formed in said substrate adjacent said double lightly doped regions, wherein one of said double lightly doped regions lies between one of said single lightly doped regions and one of said triple lightly doped regions; and heavily-doped regions formed in said substrate in said periphery portion) wherein one of said single lightly doped regions, one of said double lightly doped regions and one of said triple lightly doped regions lie between each of said heavily-doped regions and said respective channel region.

\* \* \* \* \*